(12) United States Patent
Kawachi

(10) Patent No.: US 11,355,063 B2
(45) Date of Patent: Jun. 7, 2022

(54) PIXEL CIRCUIT FOR CONTROLLING LIGHT-EMITTING ELEMENT

(71) Applicants: Tianma Japan, Ltd., Kanagawa (JP); Wuhan Tianma Micro-Electronics Co., Ltd., Wuhan (CN)

(72) Inventor: Genshiro Kawachi, Kanagawa (JP)

(73) Assignees: TIANMA JAPAN, LTD., Kanagawa (JP); WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/952,601

(22) Filed: Nov. 19, 2020

(65) Prior Publication Data
US 2021/0201778 A1  Jul. 1, 2021

(30) Foreign Application Priority Data

Dec. 26, 2019 (JP) .............................. JP2019-236986
Sep. 8, 2020 (JP) .............................. JP2020-150873

(51) Int. Cl.
*G09G 3/3233* (2016.01)
*H01L 27/32* (2006.01)
*H01L 29/786* (2006.01)

(52) U.S. Cl.
CPC ... *G09G 3/3233* (2013.01); *G09G 2300/0809* (2013.01); *G09G 2320/0257* (2013.01); *H01L 27/3262* (2013.01); *H01L 27/3265* (2013.01); *H01L 29/78645* (2013.01); *H01L 29/78675* (2013.01)

(58) Field of Classification Search
CPC ........... G09G 3/3233; G09G 2320/045; G09G 3/3258; G09G 2320/0233; G09G 3/3291; G09G 2320/043; G09G 2300/043; G09G 2300/0426; G09G 3/325; G09G 2300/0809; G09G 2320/0257; G09G 2300/0819; G09G 2310/061; G09G 2320/0295; G09G 2300/0439; G09G 2330/021; G09G 2320/0626; G09G 2320/0247; G09G 2320/0252; G09G 2320/0209; H01L 27/3262; H01L 27/3265; H01L 27/3276; H01L 27/3248
See application file for complete search history.

(56) References Cited

U.S. PATENT DOCUMENTS

| 8,976,166 | B2 * | 3/2015 | Han ..................... G09G 3/3233 345/214 |
| 10,255,860 | B2 * | 4/2019 | Na ........................ G09G 3/3233 |
| 10,847,092 | B2 * | 11/2020 | Bae ..................... G09G 3/3258 |

(Continued)

*Primary Examiner* — Duc Q Dinh
(74) *Attorney, Agent, or Firm* — Nixon & Vanderhye

(57) ABSTRACT

A pixel circuit for controlling driving current for a light-emitting element is disclosed. The pixel circuit includes a driving transistor configured to supply driving current to the light-emitting element, a first switching transistor configured to transmit a data signal corresponding to the driving current, a storage capacitor configured to receive the signal from the first switching transistor and store a voltage to be applied to a gate of the driving transistor, a second switching transistor configured to correct the voltage to be stored to the storage capacitor, and a first capacitor including an electrode connected with a drain of the driving transistor and an electrode to be supplied with a predetermined potential.

10 Claims, 21 Drawing Sheets

(56) References Cited

U.S. PATENT DOCUMENTS

| | | | |
|---|---|---|---|
| 2009/0115703 A1* | 5/2009 | Cok | G09G 3/3233 345/76 |
| 2010/0309174 A1 | 12/2010 | Tomida et al. | |
| 2016/0165700 A1 | 6/2016 | Takahashi et al. | |
| 2018/0074569 A1* | 3/2018 | An | G06F 1/3265 |
| 2019/0206328 A1* | 7/2019 | Park | H01L 27/3265 |
| 2020/0051506 A1* | 2/2020 | Yang | G09G 3/3233 |
| 2020/0403040 A1* | 12/2020 | Park | H01L 27/3265 |

* cited by examiner

COMPARATIVE EXAMPLE

COMPARATIVE EXAMPLE

POSITIVE GHOST

COMPARATIVE EXAMPLE

COMPARATIVE EXAMPLE

PIXEL CIRCUIT FOR CONTROLLING LIGHT-EMITTING ELEMENT

CROSS-REFERENCE TO RELATED APPLICATIONS

This non-provisional application claims priority under 35 U.S.C. § 119(a) on Patent Application No. 2019-236986 filed in Japan on Dec. 26, 2019 and Patent Application No. 2020-150873 filed in Japan on Sep. 8, 2020, the entire contents of which are hereby incorporated by reference.

BACKGROUND

This disclosure relates to a pixel circuit for controlling a light-emitting element.

An organic light-emitting diode (OLED) element is a current-driven self-light-emitting element and therefore, does not need a backlight. In addition to this, the OLED element has advantages for achievement of low power consumption, wide viewing angle, and high contrast ratio; it is expected to contribute to development of flat panel display devices.

An active-matrix (AM) OLED display device includes transistors for selecting pixels and driving transistors for supplying electric current to the pixels. The transistors in an OLED display device are thin film transistors (TFTs); particularly, low-temperature polysilicon (LTPS) TFTs are commonly used.

The TFTs have variations in their threshold voltage and charge mobility. Since the driving transistors determine the light emission intensity of the OLED display device, their variations in electrical characteristics could cause a problem. Hence, a typical OLED display device includes a correction circuit for compensating for the variations and shifts of the threshold voltage of the driving transistors.

An OLED display device could show a ghost image (also referred to simply as ghost) and this phenomenon is called image retention. For example, in displaying a full-screen image of an intermediate emission level after displaying a black and white checkerboard pattern for a specific period, the OLED display device displays a ghost image of the checkerboard pattern of different emission levels for a while.

This is caused by hysteresis effect of the driving transistors. The hysteresis effect causes a phenomenon in a field-effect transistor that the drain current flows differently between the case where the gate-source voltage changes from a high voltage to a low voltage and the case where the gate-source voltage changes from the low voltage to the high voltage.

That is to say, the drain current flows differently between the pixels whose emission level is changed from the black level to an intermediate level and the pixels whose emission level is changed from the white level to the intermediate level. For this reason, the OLED display device emits different intensities of light. This difference in drain current continues over several frames and therefore, the difference in intensity of emitted light is perceived as a ghost. This behavior of the drain current is referred to as transient response of the current by hysteresis effect.

SUMMARY

An aspect of this disclosure is a pixel circuit configured to control driving current for a light-emitting element. The pixel circuit includes: a driving transistor configured to supply driving current to the light-emitting element; a first switching transistor including a source, a gate, and a drain, the first switching transistor being configured to transmit a data signal corresponding to the driving current; a storage capacitor configured to receive the signal from the first switching transistor and store a voltage to be applied to the gate of the driving transistor; a second switching transistor configured to correct the voltage to be stored to the storage capacitor; and a first capacitor including an electrode connected with the drain of the driving transistor and an electrode to be supplied with a predetermined potential.

It is to be understood that both the foregoing general description and the following detailed description are exemplary and explanatory and are not restrictive of this disclosure.

EMBODIMENTS

Figure 1:
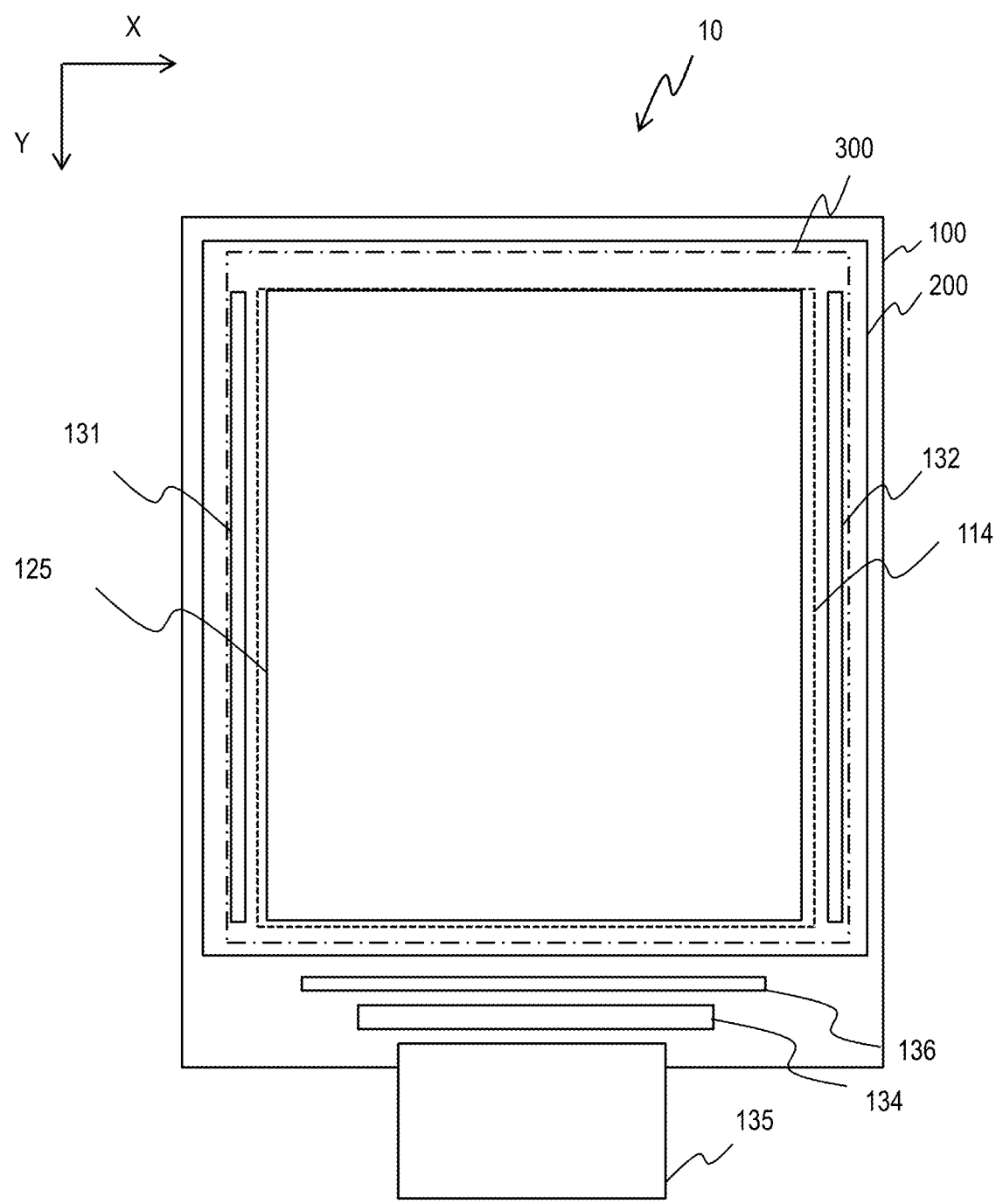
FIG. 1 schematically illustrates a configuration example of an OLED display device of a display device.

Hereinafter, embodiments of this disclosure will be specifically described with reference to the accompanying drawings. Elements common to the drawings are denoted by the same reference signs and each element in the drawings may be exaggerated in size and/or shape for clear understanding of the description.

Disclosed in the following are techniques to improve the driving current control in a light emission display device, more specifically, techniques to diminish image retention in an electro-luminescent display device. The light emission display device is a display device utilizing light-emitting elements that emit light in response to driving current, like an organic light-emitting diode (OLED) display device.

Configuration of Display Device

FIG. 1 schematically illustrates a configuration example of an OLED display device 10 of a display device. The OLED display device 10 includes a thin film transistor (TFT) substrate 100 on which OLED elements (organic light-emitting elements) are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with an inactive gas such as dry nitrogen and sealed up with the bond 300.

In the periphery of a cathode electrode region 114 outer than the display region 125 of the TFT substrate 100, scanning circuits 131 and 132, a driver IC 134, and a demultiplexer 136 are provided. The driver IC 134 is connected to the external devices via flexible printed circuits (FPC) 135. The scanning circuits 131 and 132 drive scanning lines on the TFT substrate 100.

The driver IC 134 is mounted with an anisotropic conductive film (ACF), for example. The driver IC 134 provides power and timing signals (control signals) to the scanning circuits 131 and 132 and further, provides a data signal to the demultiplexer 136.

The demultiplexer 136 outputs output of one pin of the driver IC 134 to d data lines in series (d is an integer more than 1). The demultiplexer 136 changes the output data line for the data signal from the driver IC 134 d times per scanning period to drive d times as many data lines as output pins of the driver IC 134.

The display region 125 includes a plurality of OLED elements (pixels) and a plurality of pixel circuits for controlling light emission of the plurality of pixels. In an example of a color OLED display device, each OLED element emits light in one of the colors of red, blue, and green. The plurality of pixel circuits constitute a pixel circuit array.

As will be described later, each pixel circuit includes a driving TFT (driving transistor) and a storage capacitor for storing signal voltage to determine the driving current of the driving TFT. The data signal transmitted by a data line is corrected and stored to the storage capacitor. The voltage of the storage capacitor determines the gate voltage (Vgs) of the driving TFT. The corrected data signal changes the conductance of the driving TFT in an analog manner to supply a forward bias current corresponding to the light emission level to the OLED element.

Image Retention

The OLED display device 10 of this disclosure has pixel circuits including a configuration for diminishing the ghost caused by image retention. For example, when the image displayed on an OLED display device is changed from a fixed black and white checkerboard pattern to an image of an intermediate emission level, a ghost image corresponding to the fixed pattern is displayed for a while.

The intensity and the lifetime of the ghost depend on the display period of the fixed pattern (stress time); the ghost disappears with time. Image retention produces two types of ghosts: a negative ghost having brightness and darkness opposite (having opposite polarities) from those of the fixed pattern and a positive ghost having brightness and darkness same (having the same polarities) as those of the fixed pattern.

Figure 2A:
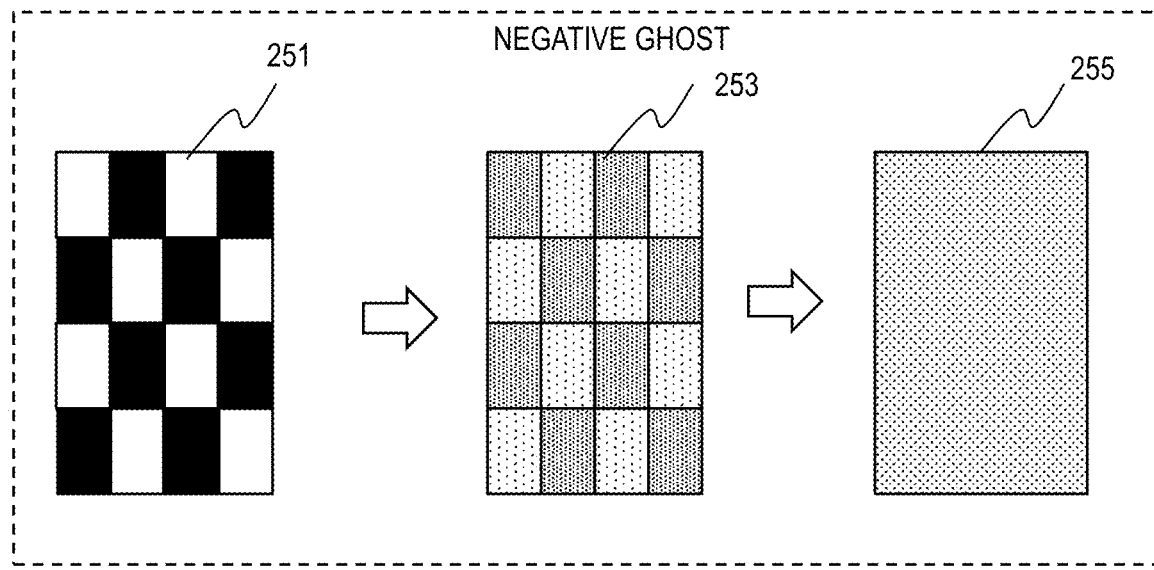
FIG. 2A schematically illustrates an example of a negative ghost.

FIG. 2A schematically illustrates an example of the negative ghost. The OLED display device 10 displays an initial image 251 of a checkerboard pattern (applies a fixed pattern stress) for a predetermined time and then tries to display an intended full-screen image 255 of an intermediate emission level. However, a ghost 253 by image retention is displayed, instead of the intended image 255. The ghost 253 is a checkerboard pattern of different intermediate emission levels.

The pattern of brightness and darkness of the ghost 253 is opposite from the pattern of brightness and darkness of the initial image 251. In other words, the bright parts of the ghost 253 correspond to the black parts of the initial image 251 and the dark parts of the ghost 253 correspond to the white parts of the initial image 251.

Figure 2B:
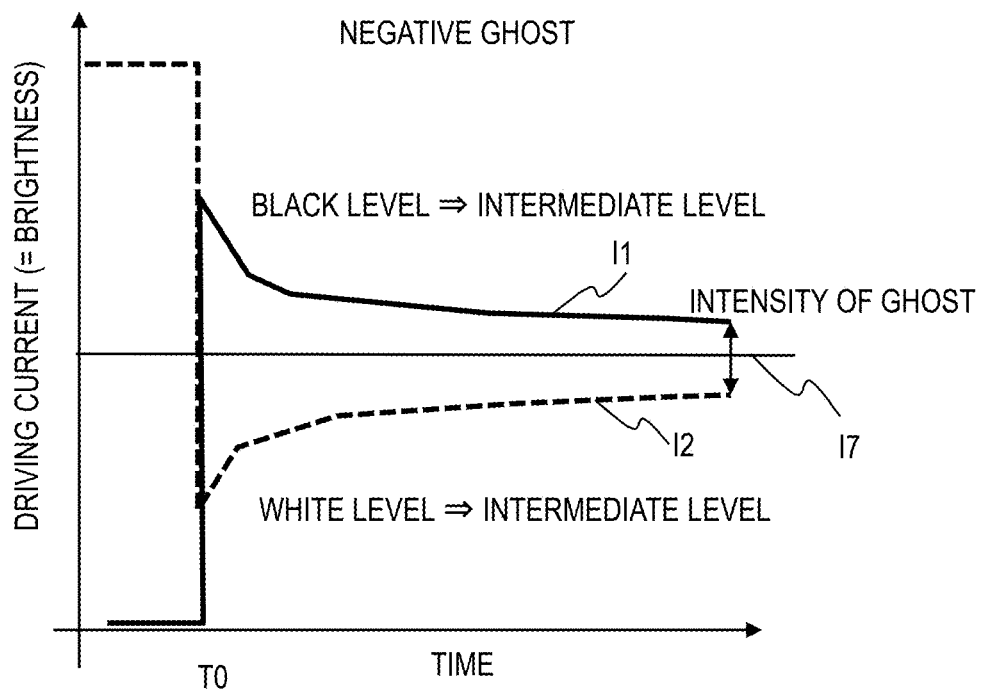
FIG. 2B illustrates variation of the driving currents for subpixels corresponding to the variation of the displayed image illustrated in FIG. 2A.

FIG. 2B illustrates variation of the driving currents for subpixels corresponding to the variation of the displayed image illustrated in FIG. 2A. The driving current is an electric current to flow in an OLED element; the brightness of the OLED element increases when the driving current is higher. In FIG. 2B, the horizontal axis represents time and the vertical axis represents driving current. The current I1 represents the driving current for a subpixel changing from black to the intermediate level. The current I2 represents the driving current for a subpixel changing from white to the intermediate level.

At a time T0, the data signals for the subpixels change from the values for the initial image 251 to the value for the intended image 255. The driving current I1 for the subpixel that has displayed black increases to higher than (overshoots) the target driving current I7 and then gradually decreases toward the target driving current I7. Conversely, the driving current I2 for the subpixel that has displayed white decreases to lower than (undershoots) the target driving current I7 and then gradually increases toward the target driving current I7.

Now, the intensity IR of the ghost is defined as follows:

$$IR=2.0\times(I1-I2)/(I1+I2).$$

The negative ghost illustrated in FIGS. 2A and 2B has an intensity IR of a positive value.

Figure 3A:
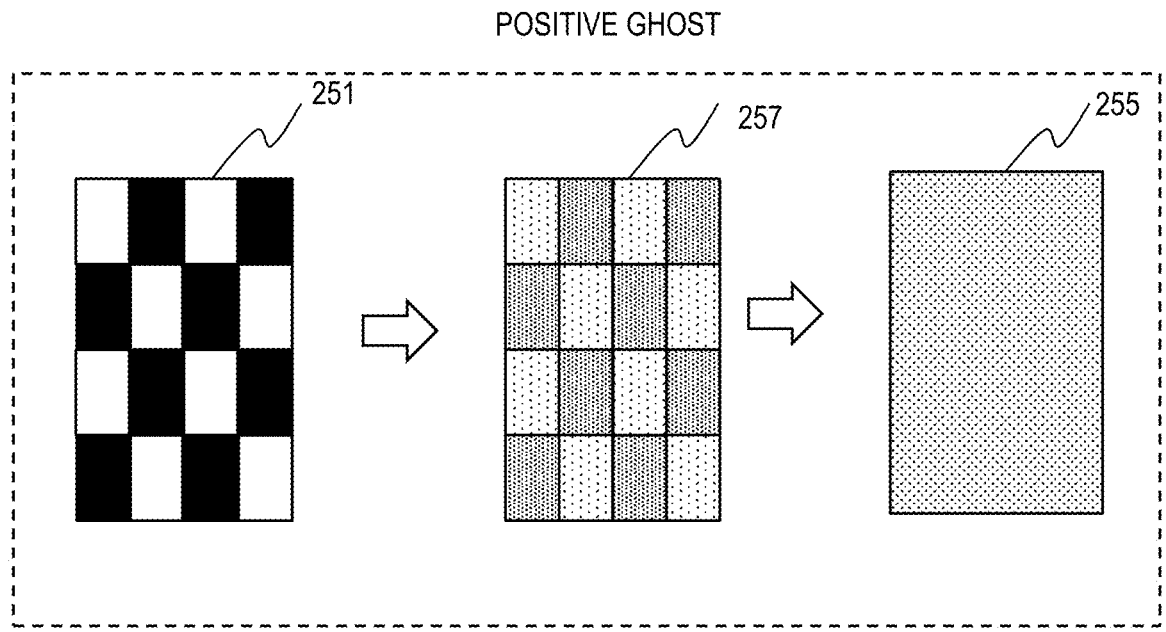
FIG. 3A schematically illustrates an example of a positive ghost.

FIG. 3A schematically illustrates an example of the positive ghost. The OLED display device 10 displays an initial image 251 of a checkerboard pattern (applies a fixed pattern stress) for a predetermined time and then tries to display an intended full-screen image 255 of an intermediate emission level. However, a ghost 257 by image retention is displayed, instead of the intended image 255. The ghost 257 is a checkerboard pattern of different intermediate emission levels.

The pattern of brightness and darkness of the ghost 257 corresponds to the pattern of brightness and darkness of the initial image 251. In other words, the bright parts of the ghost 257 correspond to the white parts of the initial image 251 and the dark parts of the ghost 257 correspond to the black parts of the initial image 251.

Figure 3B:
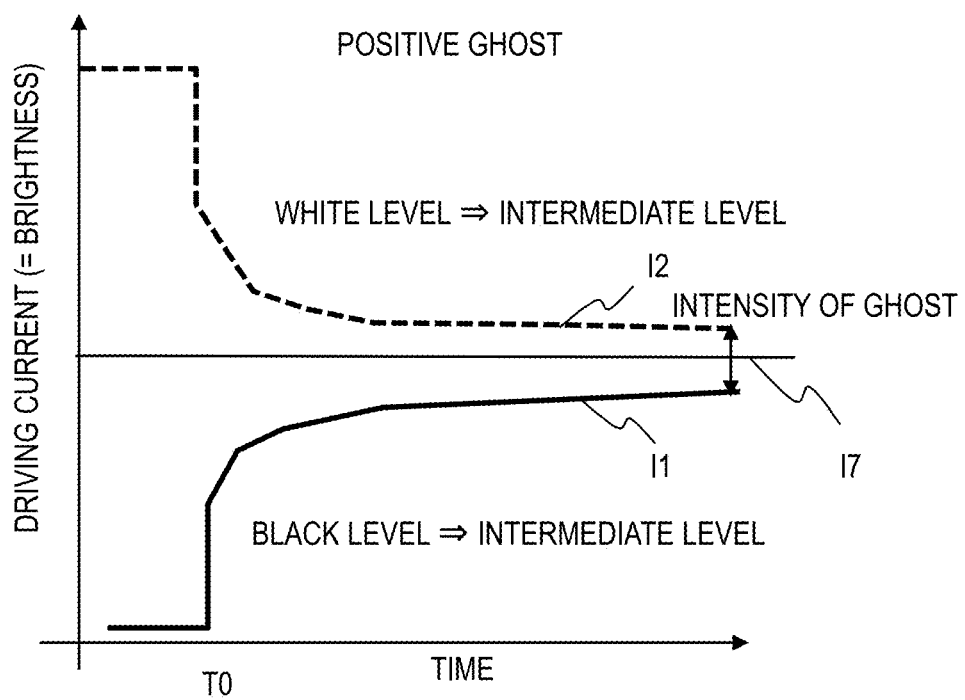
FIG. 3B illustrates variation of the driving currents for subpixels corresponding to the variation of the displayed image illustrated in FIG. 3A.

FIG. 3B illustrates variation of the driving currents for subpixels corresponding to the variation of the displayed image illustrated in FIG. 3A. In FIG. 3B, the horizontal axis represents time and the vertical axis represents driving current. The current I1 represents the driving current for a subpixel changing from black to the intermediate level. The current I2 represents the driving current for a subpixel changing from white to the intermediate level.

At a time T0, the data signals for subpixels (the pixel circuits therefor) change from the values for the initial image 251 to the value for the intended image 255. The driving current I1 for the subpixel that has displayed black drastically increases to a value lower than the target driving current I7 and then gradually increases toward the target driving current I7. Conversely, the driving current I2 for the subpixel that has displayed white drastically decreases to a value higher than the target driving current I7 and then gradually decreases toward the target driving current I7. The positive ghost illustrated in FIGS. 3A and 3B has an intensity IR of a negative value.

The major cause of image retention is the transient response characteristic of the driving TFTs; whether the image retention (ghost) is positive or negative is determined by the corrective action of the pixel circuits (TFT substrate) to the threshold voltages of the driving TFTs. In the following, the relation among the image retention, the characteristic of a driving TFT, and the corrective action of a pixel circuit to the data signal is described specifically.

Figure 4:
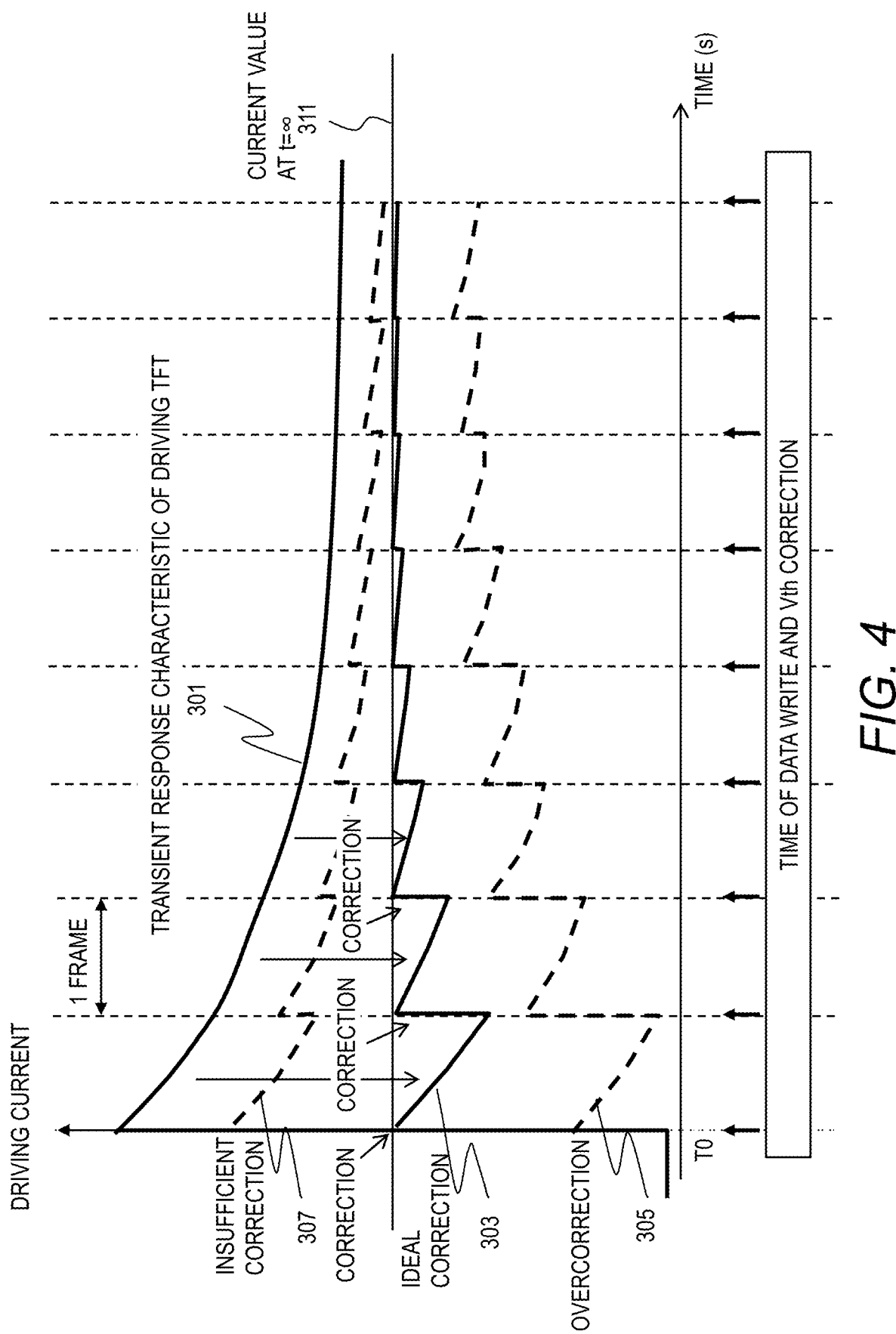
FIG. 4 is a graph for explaining the relation among image retention in an OLED display device, a characteristic of a driving TFT, and the corrective action of a pixel circuit to the data signal.

FIG. 4 is a graph for explaining the relation among image retention in an OLED display device 10, a characteristic of a driving TFT, and the corrective action of a pixel circuit to the data signal. In the graph of FIG. 4, the horizontal axis represents time and the vertical axis represents the driving current supplied to an OLED element. The driver IC 134 writes a new data signal to a pixel circuit in every frame. The pixel circuit corrects the threshold voltage of the driving TFT (Vth correction) by correcting the data signal (voltage) from the driver IC 134 and stores the data signal to a storage capacitor.

In the example in FIG. 4, the driver IC 134 changes the data signal to be supplied to the pixel circuit at a time T0 from a data signal of the black level to a data signal of an intermediate level. Thereafter, the driver IC 134 writes a data signal of the intermediate level to the pixel circuit in each frame. The pixel circuit performs Vth correction on the data signal (voltage) and stores the corrected data signal to the storage capacitor.

The line 301 represents the transient response characteristic of the driving TFT from the black level to the intermediate level (when Vth correction is not performed). The driving current in accordance with the transient response characteristic 301 of the driving TFT increases from the value of the black level and overshoots the target current value 311 of the intermediate level at the time T0 and thereafter, gradually decreases to approach the target current value 311. The driving TFT has a negative transient response characteristic.

The line 303 represents variation of ideally corrected driving current. The ideal driving current 303 becomes the target current value 311 every time the driver IC 134 writes a data signal and thereafter, varies in accordance with the transient response characteristic of the driving TFT.

The line 305 represents variation of overcorrected driving current. This correction changes the driving current so that the transient response characteristic of the driving TFT will be compensated for. Accordingly, the overcorrected driving current 305 becomes lower than the target current value 311 every time the driver IC 134 writes a data signal and thereafter, varies in accordance with the transient response characteristic of the driving TFT. The excessive amount of correction gradually becomes smaller so that the driving current gradually becomes closer to the target current value 311. In the case of overcorrection, the response of the driving current has the polarity opposite to the transient response of the driving TFT; positive image retention occurs.

The line 307 represents variation of insufficiently corrected driving current. This correction changes the driving current so that the transient response characteristic of the driving TFT will be compensated for. Accordingly, the insufficiently corrected driving current 307 becomes higher than the target current value 311 every time the driver IC 134 writes a data signal and thereafter, varies in accordance with the transient response characteristic of the driving TFT. The insufficient correction gradually moderated so that the driving current gradually becomes closer to the target current value 311. In the case of insufficient correction, the response of the driving current has the polarity same as the transient response of the driving TFT; negative image retention occurs.

As described above, image retention is caused by the transient response of the electric current because of the hysteresis effect of the driving TFT and the corrective action of the pixel circuit. Since the corrective action of the pixel circuit is determined by the circuitry of the pixel circuit, the intensity of the ghost (image retention) can be made closely to zero by designing the pixel circuit appropriately.

Embodiments of this disclosure provide pixel circuits including a circuit (circuit element) for adjusting its corrective action. As a result, a pixel circuit to diminish the ghost by image retention can be designed easily.

Pixel Circuit

Figure 5:
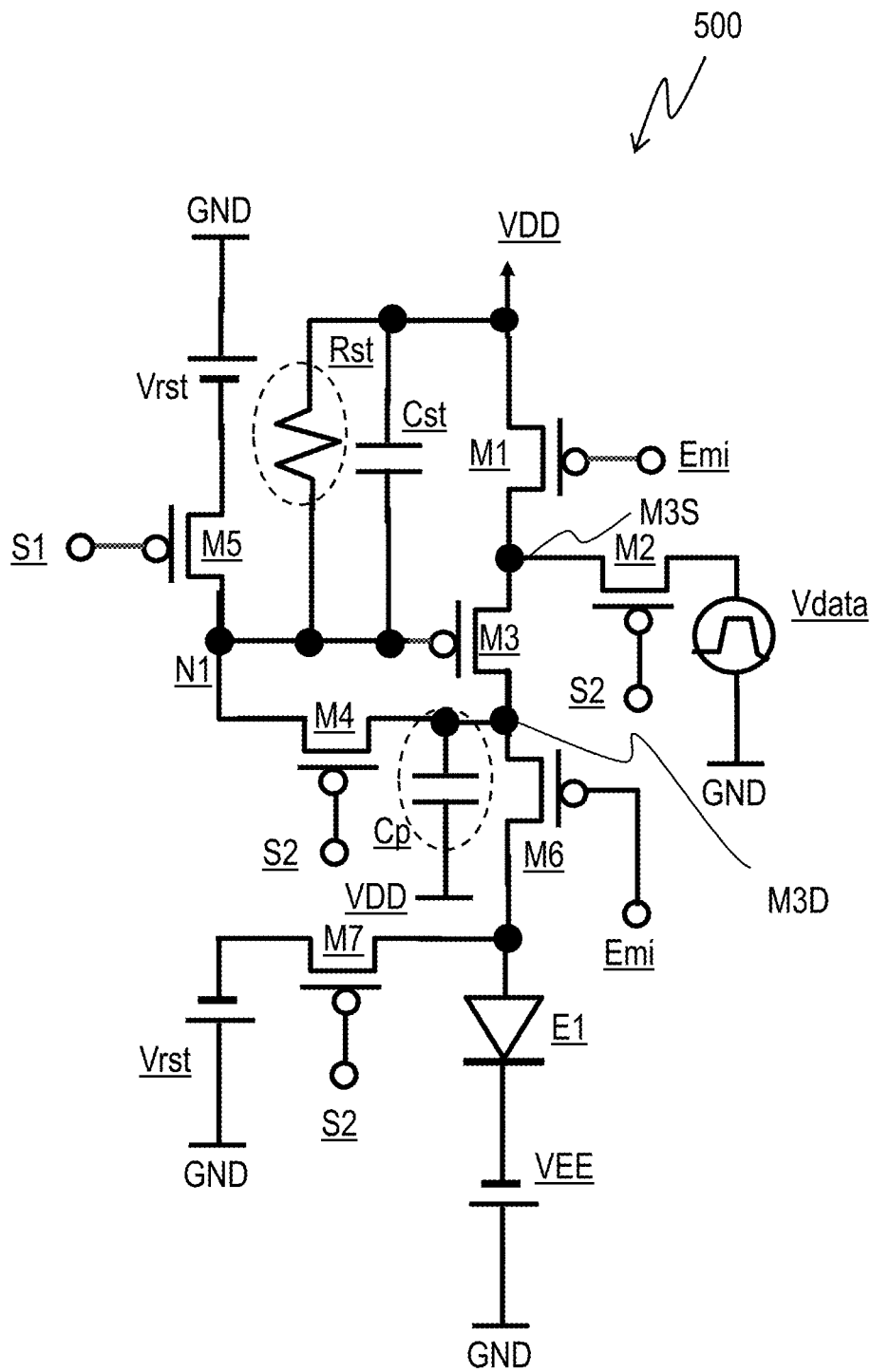
FIG. 5 illustrates a configuration example of a pixel circuit in an embodiment of this disclosure.

FIG. 5 illustrates a configuration example of a pixel circuit 500 in an embodiment of this disclosure. The pixel circuit 500 includes corrective-action adjustment elements (circuits). In the pixel circuit 500, a capacitor (first capacitor) Cp and a resistor Rst function to adjust the corrective action to reduce image retention. The resistor Rst can be optional. The pixel circuit 500 corrects a data signal supplied from the driver IC 134 and controls the light emission of an OLED element with the corrected data signal. The pixel circuit 500 includes seven transistors (TFTs) M1 to M7 each having a gate terminal, a source terminal, and a drain terminal. The transistors M1 to M7 in this example are p-type TFTs.

The transistor M3 is a driving transistor for controlling the amount of the electric current to the OLED element E1. The driving transistor M3 controls the amount of the electric current to be supplied from an anode power supply VDD to the OLED element E1 in accordance with the voltage held by the storage capacitor Cst. The cathode of the OLED element E1 is connected with a cathode power supply VEE. The storage capacitor Cst holds the gate-source voltage (also referred to simply as gate voltage) of the driving transistor M3.

The transistors M1 and M6 control whether to light the OLED element E1. The transistor (third switching transistor) M1 is connected with the anode power supply VDD through its source terminal to switch ON/OFF the supply of electric current to the driving transistor M3 connected through its drain terminal. The transistor (fifth switching transistor) M6 is connected with the drain terminal of the driving transistor M3 through its source terminal to switch ON/OFF the supply of electric current to the OLED element E1 connected through its drain terminal. The transistors M1 and M6 are controlled by the emission control signal Emi input from the scanning circuit 131 or 132 to their gate terminals.

The transistor (sixth switching transistor) M7 works to supply a reset potential (second reset potential) to the anode of the OLED element E1. In response to input of the selection signal S2 from the scanning circuit 131 or 132 to the gate terminal, the transistor M7 is turned ON to supply the reset potential from the reset power supply Vrst to the anode of the OLED element E1. The other terminal of the reset power supply Vrst is connected with the GND.

The transistor (fourth switching transistor) M5 controls whether to supply a reset potential (first reset potential) to the gate of the driving transistor M3. In response to input of the selection signal S1 from the scanning circuit 131 or 132 to the gate terminal, the transistor M5 is turned ON to supply the reset potential from the reset power supply Vrst connected with the drain terminal to the gate of the driving transistor M3. The other terminal of the reset power supply Vrst is connected with the GND. The reset potential to the gate of the driving transistor M3 can be different from the reset potential to the anode of the OLED element E1.

The transistor (first switching transistor) M2 is a selection transistor for selecting the pixel circuit 500 to be supplied with a data signal. The gate voltage of the transistor M2 is controlled by the selection signal S2 supplied from the scanning circuit 131 or 132. When the selection transistor M2 is ON, it supplies the data signal Vdata supplied from the driver IC 134 through a data line to the gate of the driving transistor M3 (the storage capacitor Cst).

The selection transistor M2 (the source and the drain thereof) in this example is connected between the data line and the source M3S of the driving transistor M3. Further, the transistor (second switching transistor) M4 is connected between the drain M3D and the gate of the driving transistor M3.

The transistor M4 works to correct the threshold voltage of the driving transistor M3. When the transistor M4 is ON, the driving transistor M3 becomes a diode-connected transistor. The data signal Vdata from the data line is supplied to the storage capacitor Cst through the selection transistor M2 in an ON state and the channels (the sources and the drains) of the driving transistor M3 and the transistor M4.

The storage capacitor Cst stores the gate-source voltage of the driving transistor M3. In the example in FIG. 5, one end of the storage capacitor Cst is connected with the gate of the driving transistor M3 and the other end is connected with a node between the source of the transistor M1 and the anode power supply VDD.

The storage capacitor Cst stores the data signal (voltage) corrected depending on the threshold voltage Vth of the driving transistor M3. As illustrated in FIG. 5, the pixel circuit 500 includes another capacitor Cp whose one end is connected with the drain (a node on the drain side) of the driving transistor M3. The one end (electrode) of the capacitor Cp has a potential equal to the potential of the drain and the other end (electrode) is supplied with a fixed potential. In the configuration example in FIG. 5, the other end of the capacitor Cp is connected with the anode power supply VDD. The value and the polarity of the fixed potential to be supplied to the other end of the capacitor Cp are not limited specifically.

The pixel circuit 500 further includes a finite resistor Rst connected in parallel with the storage capacitor Cst. One end of the resistor Rst is connected with the gate of the driving transistor M3 and the other end is connected with a node between the source of the transistor M1 and the anode power supply VDD. As will be described later, the ghost by image retention can be reduced to close to zero by appropriately selecting the values of the storage capacitor Cst, the capacitor Cp, and the resistor Rst.

Figure 6:
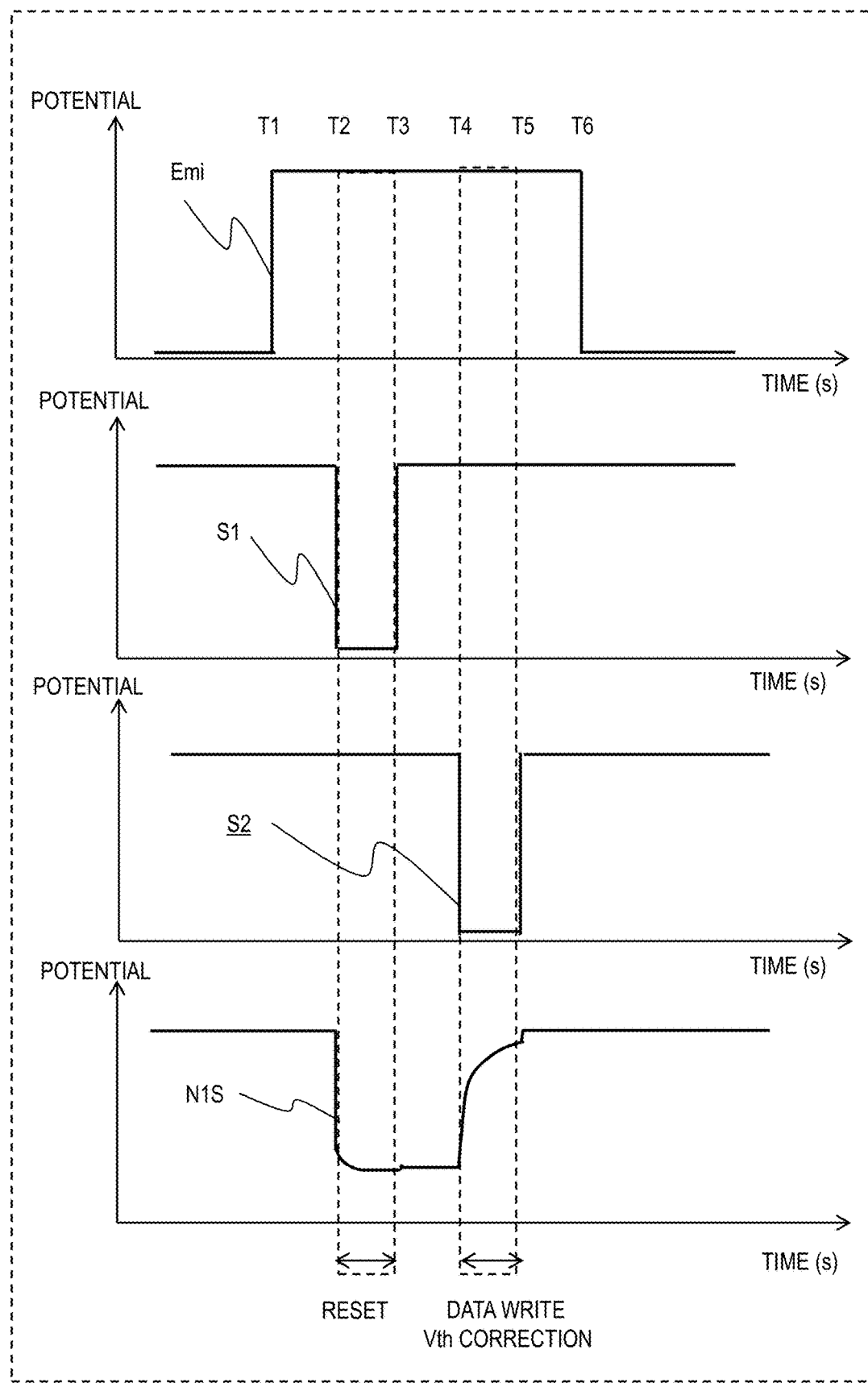
FIG. 6 is a timing chart of signals for controlling the pixel circuit in FIG. 5 in one frame period.

FIG. 6 is a timing chart of signals for controlling the pixel circuit 500 in FIG. 5 in one frame period. The timing chart of FIG. 6 is to select the N-th row and write a data signal Vdata to the pixel circuit 500. Specifically, FIG. 6 illustrates changes of the emission control signal Emi, the selection signal S1, the selection signal S2, and the potential N1S of the node N1 in FIG. 5 in one frame. The potential N1S of the node N1 is equal to the gate potential of the driving transistor M3.

The emission control signal Emi changes from Low to High at a time T1. The transistors M1 and M6 are turned OFF in accordance with this control signal. At this time T1, the selection signals S1 and S2 are High. The transistors M2, M4, M5, and M7 are OFF in accordance with these control signals. These states of the transistors are maintained until a time T2 later than the time T1. The node potential N1S is the signal potential of the previous frame.

The selection signal S1 changes from High to Low at the time T2. At this time T2, the emission control signal Emi and the selection signal S2 are High. The transistor M5 is turned ON in accordance with the change of the selection signal S1. The transistors M1, M2, M4, M6, and M7 are OFF. The node potential N1S changes to the potential of the reset power supply Vrst in response to the transistor M5 becoming ON. The reset potential is supplied to the node N1 from the time T2 to a time T3. Applying the reset potential to the node N1 in each frame makes the gate potential of the driving transistor fall to the same value in each frame; the effect of hysteresis is reduced.

The selection signal S1 changes from Low to High at the time T3. At this time T3, the emission control signal Emi and the selection signal S2 are High. The transistor M5 is turned OFF in accordance with the change of the selection signal S1. The transistors M1, M2, and M4 to M7 are OFF from the time T3 to a time T4.

The selection signal S2 changes from High to Low at the time T4. At this time T4, the emission control signal Emi and the selection signal S1 are High. The transistors M2, M4, and M7 are turned ON in accordance with the change of the selection signal S2. The transistors M1, M5, and M6 are OFF.

The reset potential of the reset power supply Vrst is supplied to the anode of the OLED element E1 by the transistor M7 becoming ON. Since the transistor M4 is ON, the driving transistor M3 is diode-connected. Since the transistor M2 is ON, the data signal Vdata from the data line is written to the storage capacitor Cst through the transistors M2, M3, and M4.

The voltage to be written to the storage capacitor Cst is a voltage obtained by correcting the data signal Vdata so as to include correction to the threshold voltage Vth of the driving transistor M3. In the period from the time T4 to a time T5, write of the data signal Vdata to the pixel circuit 500 and Vth correction to the data signal Vdata are performed.

The selection signal S2 changes from Low to High at the time T5. At this time T5, the emission control signal Emi and the selection signal S1 are High. The transistors M2, M4, and M7 are turned OFF in accordance with the change of the selection signal S2. The transistors M1, M2, and M4 to M7 are OFF. The control signals and the transistors are maintained in these states from the time T5 to at a time T6.

The emission control signal Emi changes from High to Low at the time T6 and the transistors M1 and M6 are turned from OFF to ON. The selection signals S1 and S2 are High and the transistors M2, M4, M5, and M7 are still OFF. The driving transistor M3 controls the driving current to be supplied to the OLED element E1 based on the corrected data signal stored in the storage capacitor Cst. This means that the OLED element E1 emits light.

The above-described operation of the pixel circuit indicates that the amount of correction to the threshold voltage Vth, or the point of the node potential N1S attained in the period from the time T4 to the time T5, can be controlled by changing the period in which the selection signal S2 is Low. The point attained by the node potential N1S determines whether the correction to the threshold voltage Vth is excessive or insufficient.

However, this period is also to write the data signal Vdata. Therefore, the flexibility to actually change the Low period of the selection signal S2 is small. Accordingly, if a pixel circuit capable of controlling the ghost can be configured with something other than the selection signal S2 without increasing the size and the manufacturing process of the pixel circuit, the OLED display device attains more improvement in performance.

The intensity of the ghost can be reduced to close to zero by appropriately selecting the capacitances of the storage capacitor Cst and the capacitor Cp, and the resistance of the resistor Rst, as mentioned above. Hereinafter, a method of designing these circuit elements is described.

Figure 7:
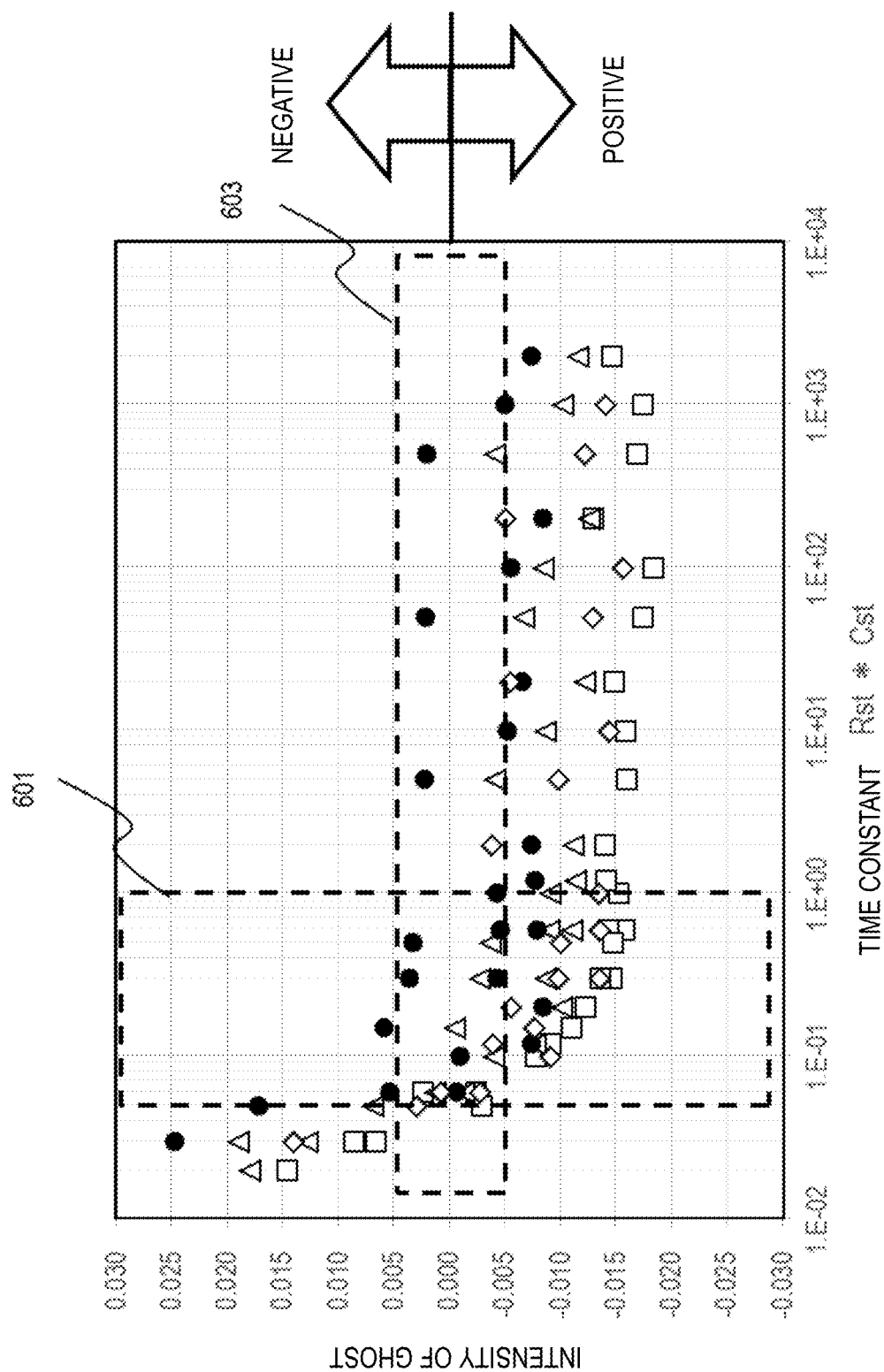
FIG. 7 provides simulation results about the relation between the time constant τst and the intensity of the ghost.

FIG. 7 provides simulation results about the relation between the time constant τst and the intensity of the ghost. The time constant τst is the product of the capacitance of the storage capacitor Cst and the resistance of the resistor Rst (the value of Cst*the value of Rst). In the graph of FIG. 7, the horizontal axis represents the time constant τst and the vertical axis represents the intensity of the ghost. The point marks having different shapes represent relations between the time constant τst and the intensity of the ghost in the cases where the capacitor Cp has different capacitances. In the graph of FIG. 7, the results showing different intensities under the conditions of the same capacitance of the capacitor Cp and the same time constant are based on different combinations of a capacitance of the storage capacitor Cst and a resistance of the resistor Rst.

When the intensity of the ghost is higher than 0, the ghost (image retention) is negative; when the intensity of a ghost is lower than 0, the ghost (image retention) is positive. The simulation results in FIG. 7 indicate that a positive ghost can be changed toward a negative ghost by decreasing the time constant τst. Conversely, a negative ghost can be changed toward a positive ghost by increasing the time constant τst.

The intensity of the ghost can be controlled to almost zero in a range 601 where the time constant τst is not less than 0.05 seconds (s) but not more than 0.1 s. From the point of view for less perceivable ghosts, it is generally known that the human eye cannot perceive a difference in brightness between regions adjacent to each other, if the difference is less than 1%. Therefore, the intensity of the ghost is designed to be in a range 603 where the absolute value of the intensity is not more than 0.005 (the value is not less than −0.005 but not more than +0.005), for example.

Figure 8A:
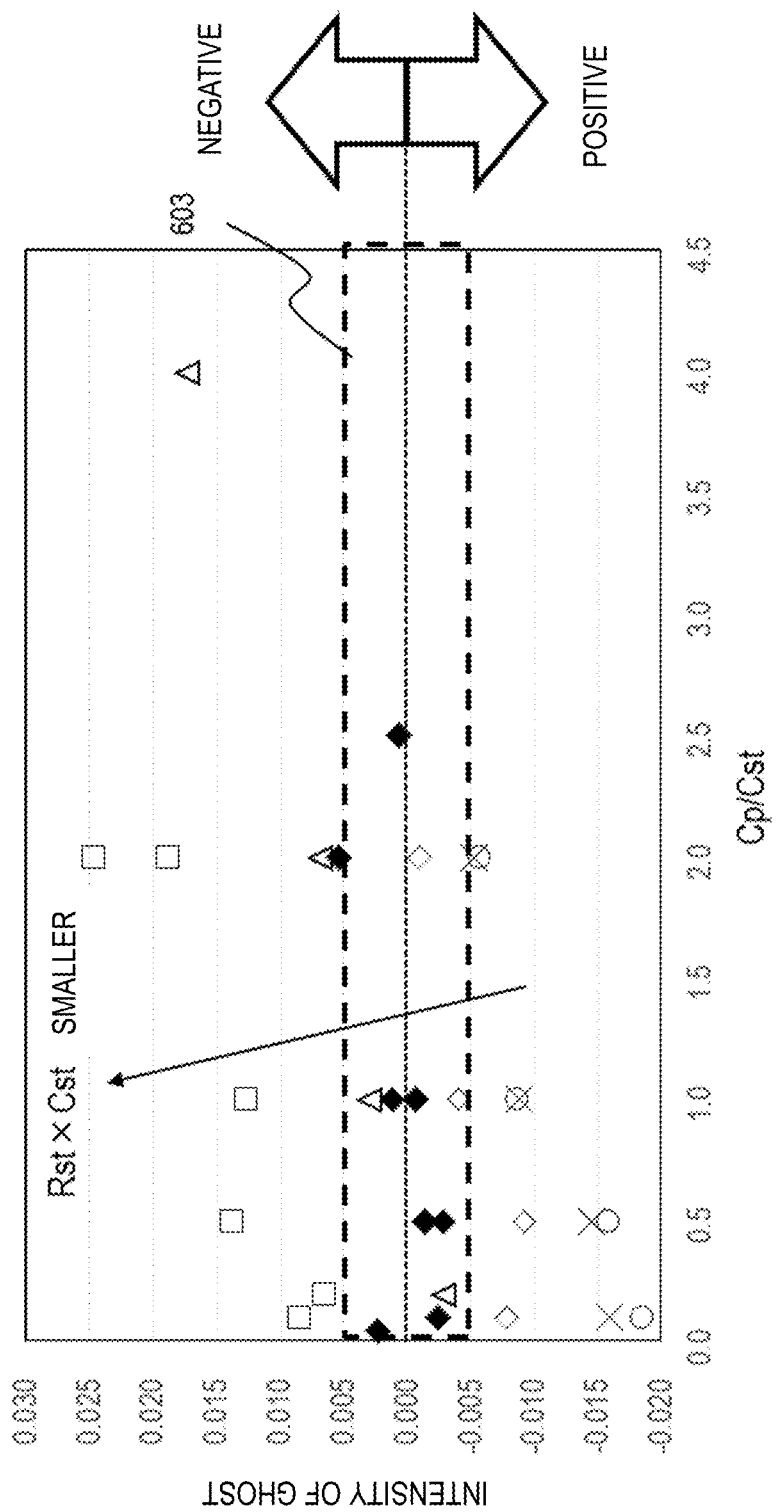
FIG. 8A provides simulation results about the relation between the value of the ratio of the capacitance of the capacitor Cp to the capacitance of the storage capacitor Cst and the intensity of the ghost.

FIG. 8A provides simulation results about the relation between the value of the ratio of the capacitance of the capacitor Cp to the capacitance of the storage capacitor Cst (the value of Cp/the value of Cst) and the intensity of the ghost. The horizontal axis represents the value of the capacitance ratio (the value of Cp/the value of Cst) and the vertical axis represents the intensity of the ghost. The point marks having different shapes represent relations between the value of the ratio of the capacitance of the capacitor Cp to the capacitance of the storage capacitor Cst and the intensity of the ghost in the cases where the time constant τst (the value of Cst*the value of Rst) takes different values. In the graph of FIG. 8A, the results showing different intensities under the conditions of the same time constant and the same value of the capacitance ratio are based on different combinations of a capacitance of the storage capacitor Cst and the resistance of the resistor Rst.

The simulation results in FIG. 8A indicate that a negative intensity of the ghost changes toward zero as the capacitance of the capacitor Cp (the value of Cp/the value of Cst) decreases. Conversely, a positive intensity of the ghost changes toward zero as the capacitance of the capacitor Cp increases. The simulation results in FIG. 8A further indicate that the intensity of the ghost can be reduced in a wider range of time constant when the condition that the capacitance of the capacitor Cp is larger than the capacitance of the storage capacitor Cst (the value of Cp>the value of Cst) is satisfied.

Figure 8B:
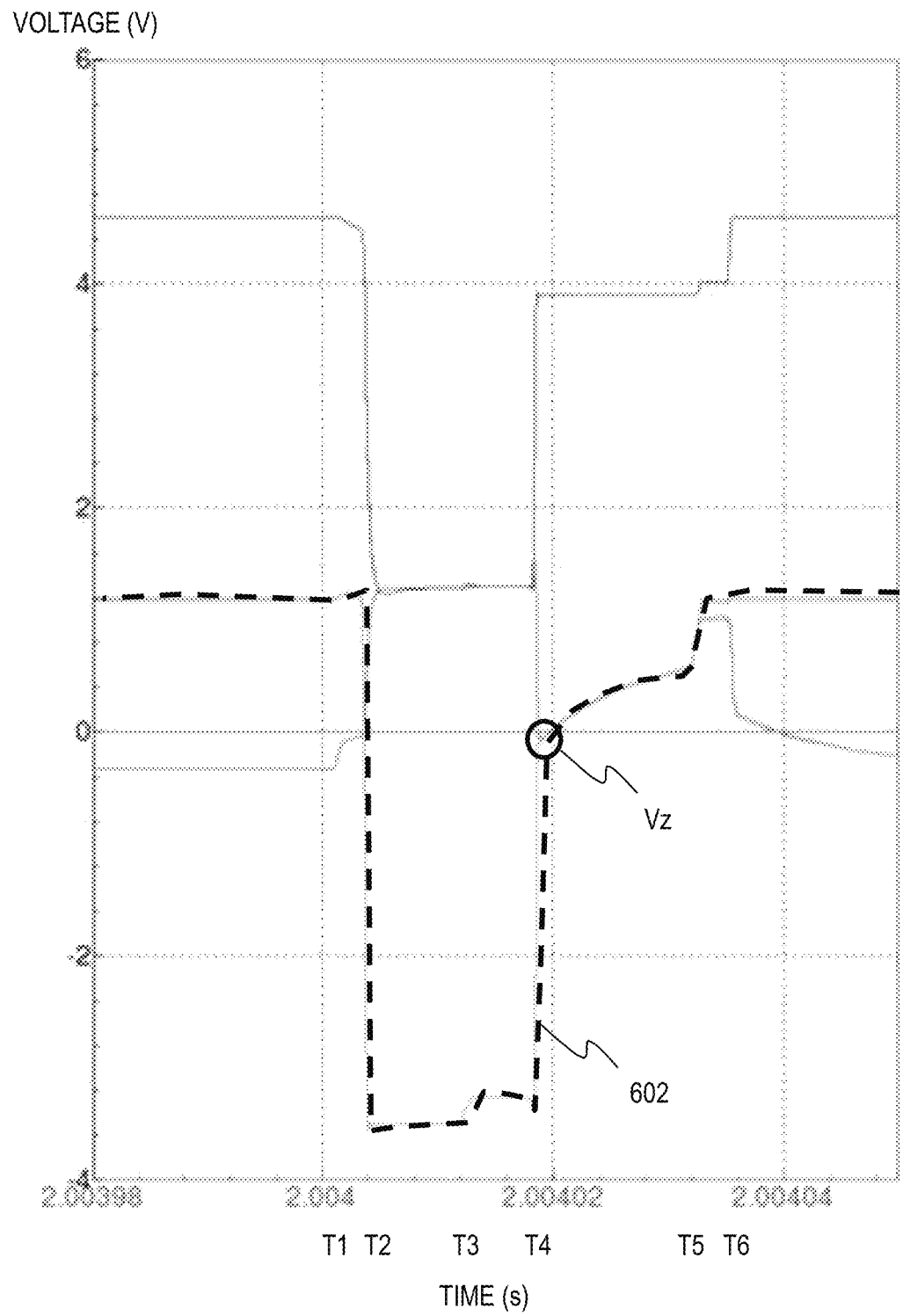
FIG. 8B provides a waveform of the voltage at a node N1 in the case where the value of the capacitor Cp is larger than the value of the storage capacitor Cst.
Figure 8C:
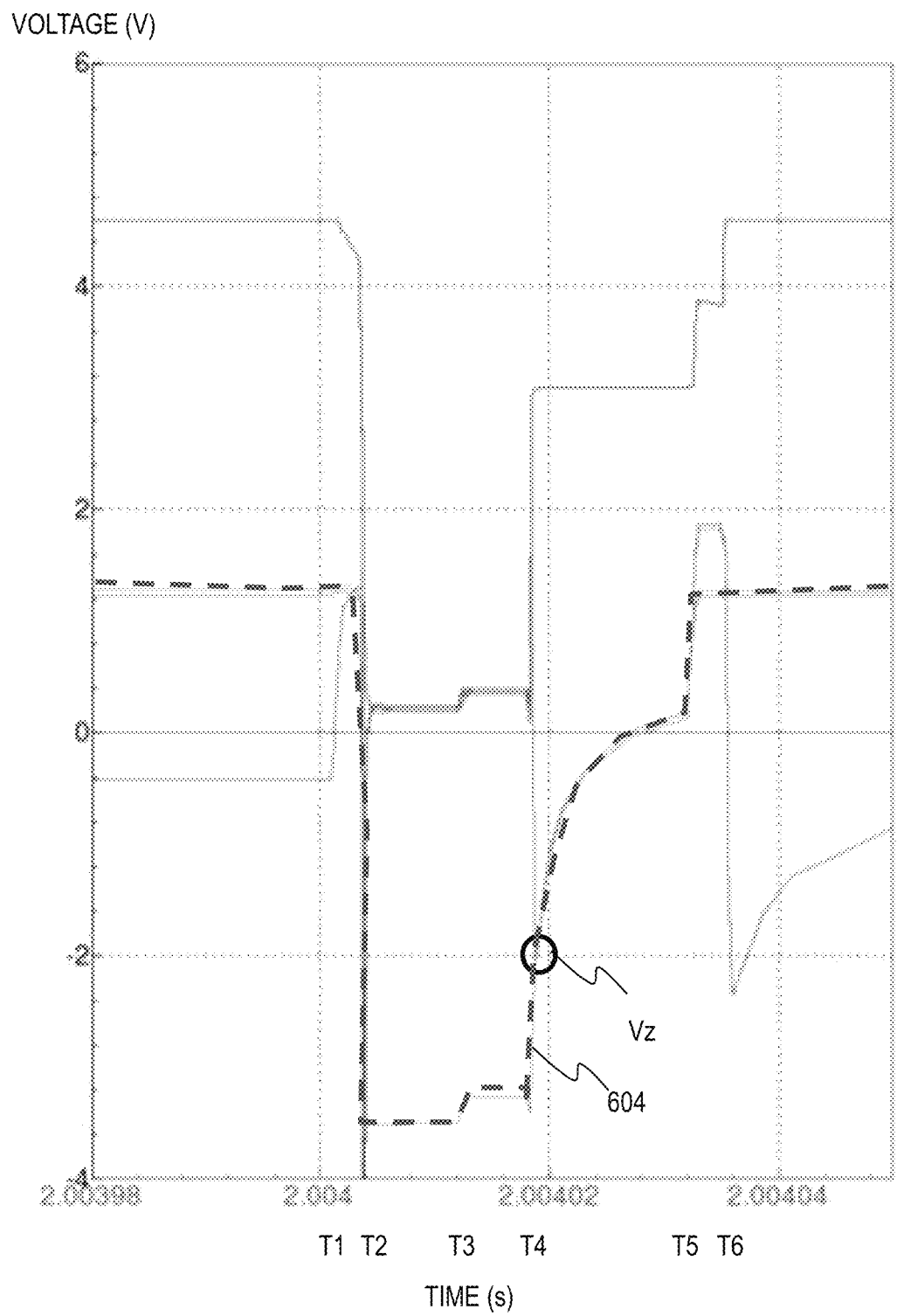
FIG. 8C provides a waveform of the voltage at the node N1 in the case where the value of the capacitor Cp is smaller than the value of the storage capacitor Cst.

The action of the capacitor Cp can be generally presumed as follows. In FIG. 8B, the broken line 602 represents the waveform of the voltage at the node N1 in the case where the value of the capacitor Cp is larger than the value of the storage capacitor Cst. In FIG. 8C, the broken line 604 represents the waveform of the voltage at the node N1 in the case where the value of the capacitor Cp is smaller than the value of the storage capacitor Cst. The times T1 to T6 in FIGS. 8B and 8C correspond to the times T1 to T6 in FIG. 6.

At the instance when the selection signal S2 becomes Low at the time T4, redistribution of charges starts between the charges Qst held by the storage capacitor Cst and the charges Qp held by the capacitor Cp. The potential Vz of the node N1 at the time T4 is the following value determined by the ratio of the value of the capacitor Cp to the value of the storage capacitor Cst.

$$V_Z = \frac{C_p V_X + C_{st} V_{rst}}{C_p + C_{st}} \qquad (1)$$

where Vx represents the potential of the drain node of the driving transistor M3 immediately before the time T1 and Vrst represents the reset potential of the reset power supply Vrst. The reset potential Vrst is usually equal to the potential of the VEE or a negative value close thereto; the relation of Vrst<Vx is always satisfied. According to the formula (1), if the value of the storage capacitor Cst is larger than the value of the capacitor Cp, the value Vz takes a negative value close to the reset potential Vrst; if the value of the capacitor Cp is larger than the value of the storage capacitor Cst, the value Vz takes a value close to the value Vx.

These characteristics are shown in FIGS. 8B and 8C. The current value for charging the storage capacitor Cst through the channel of the driving transistor M3 in the period from the time T4 to the time T5 depends on the value Vz. When Vz is more negative, more charging current is necessary. As the Vz shifts toward the positive, the charging current decreases. This difference in the value Vz makes difference in the amount of Vth correction and the image retention as well.

Figure 9:
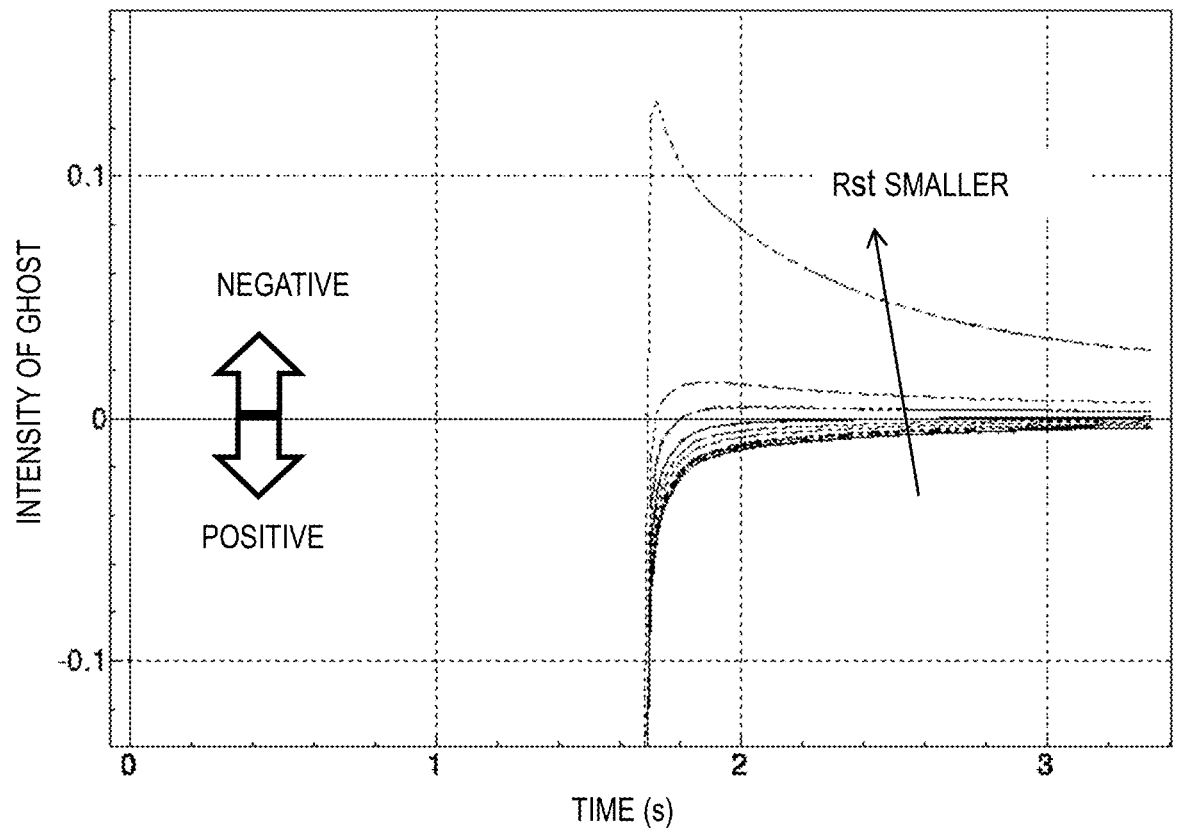
FIG. 9 provides simulation results about the temporal variation in the intensity of the ghost in the cases where the resistor Rst has different resistances.

FIG. 9 provides simulation results about the temporal variation in the intensity of the ghost in the cases where the resistor Rst has different resistances. The horizontal axis represents time and the vertical axis represent the intensity of the ghost. As indicated by the simulation results in FIG. 9, the ghost by image retention transforms from a positive ghost to a negative ghost as the resistance of the resistor Rst becomes smaller and conversely, transforms from a negative ghost to a positive ghost as the resistance of the resistor Rst becomes larger.

The action of the resistor Rst can be generally presumed as follows. The resistor Rst discharges the storage capacitor Cst, so that the driving current of the driving transistor M3 decreases. This means that the resistor Rst reduces the amount of correction to the data signal, so that the operation of the driving transistor M3 changes in the direction from an excessively corrected state to an insufficiently corrected state. That is to say, the ghost by image retention transforms from a positive ghost to a negative ghost.

Figure 10:
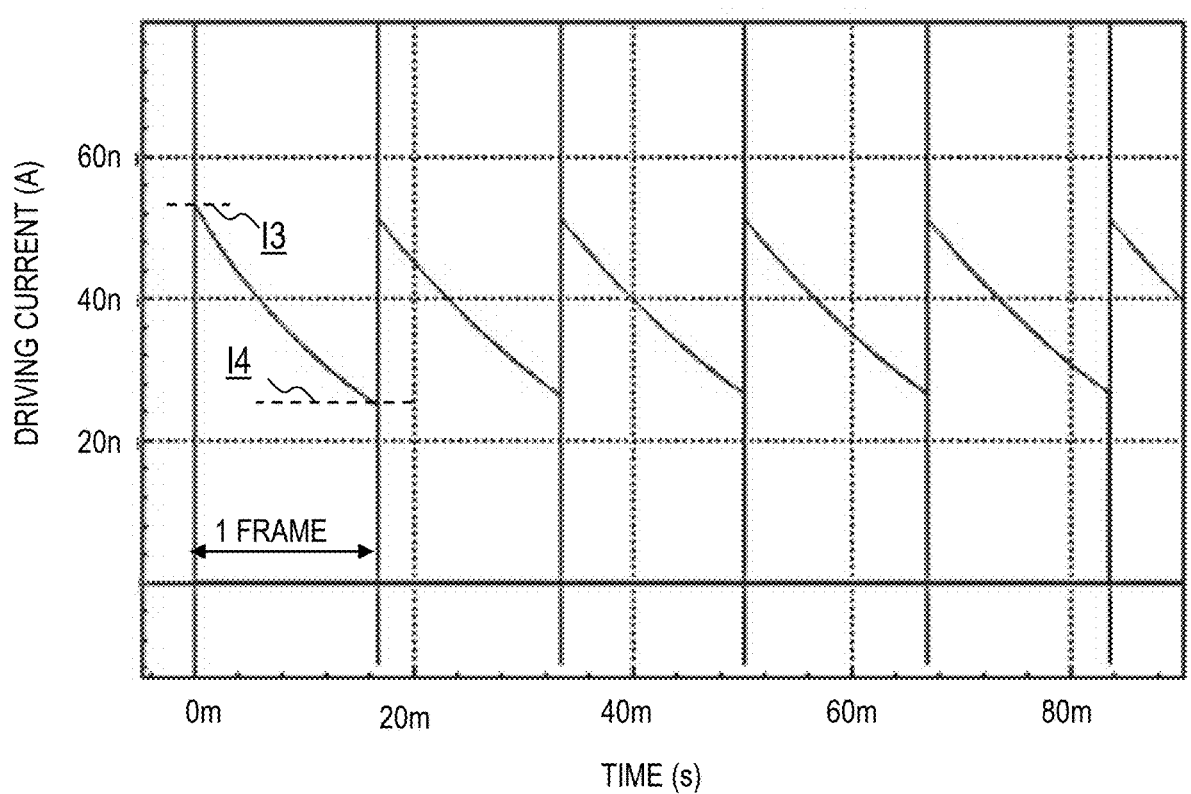
FIG. 10 schematically illustrates variation in brightness in a frame caused by the resistor Rst.

In this connection, when the resistance of the resistor Rst is small, the driving current decreases during a frame period with discharge of the storage capacitor Cst to cause a variation in brightness (flicker). FIG. 10 schematically illustrates the variation in brightness in a frame caused by the resistor Rst. In the graph of FIG. 10, the horizontal axis represents time and the vertical axis represents driving current. As the storage capacitor Cst is discharged because of the resistor Rst, the decrease of the driving current in a frame period increases to cause a larger variation in brightness.

The intensity F of the flicker is defined as follows:

$$F=(I3-I4)/(I3+I4),$$

where I3 represents the driving current at the beginning of a frame and I4 represents the driving current at the end of the frame.

Figure 11:
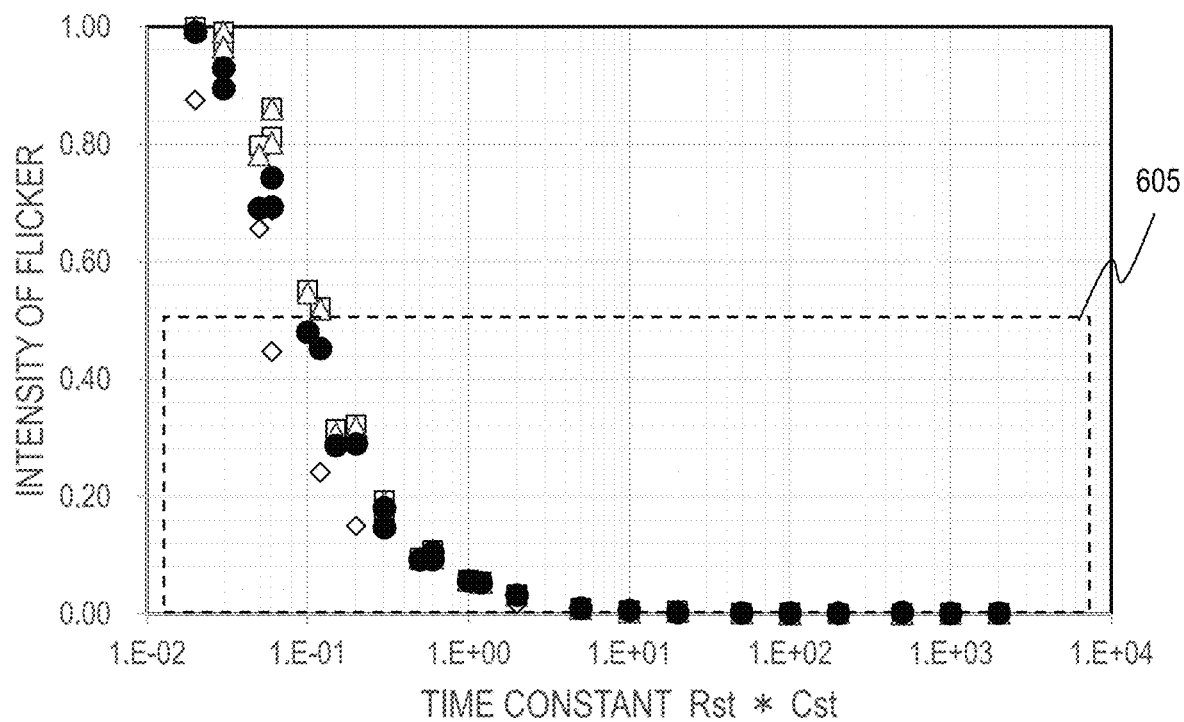
FIG. 11 provides simulation results about the relation between the intensity of the flicker and the time constant τst.

FIG. 11 provides simulation results about the relation between the intensity F of the flicker and the time constant τst (the value of Cst*the value of Rst). The horizontal axis represents the time constant τst (the value of Cst*the value of Rst) and the vertical axis represents the intensity F of the flicker. The point marks having different shapes represent relations between the time constant and the intensity of the flicker in the cases where the capacitor Cp has different capacitances.

From the point of view of the image quality of the OLED display device 10, the intensity of the flicker is selected to be in the range 605 of not more than 0.5, for example. According to the simulation results in FIG. 11, the corresponding range of the time constant τst is not less than 0.1 s. As indicated by the simulation results in FIG. 11, the intensity of the flicker does not depend on the capacitance of the capacitor Cp.

As described above, it is important to determine the value of the ratio of the capacitance of the capacitor Cp to the capacitance of the storage capacitor Cst (the value of Cp/the value of Cst) and the time constant τst (the value of Cst*the value of Rst) from both points of view of the intensity of the ghost and the intensity of the flicker.

Figure 12:
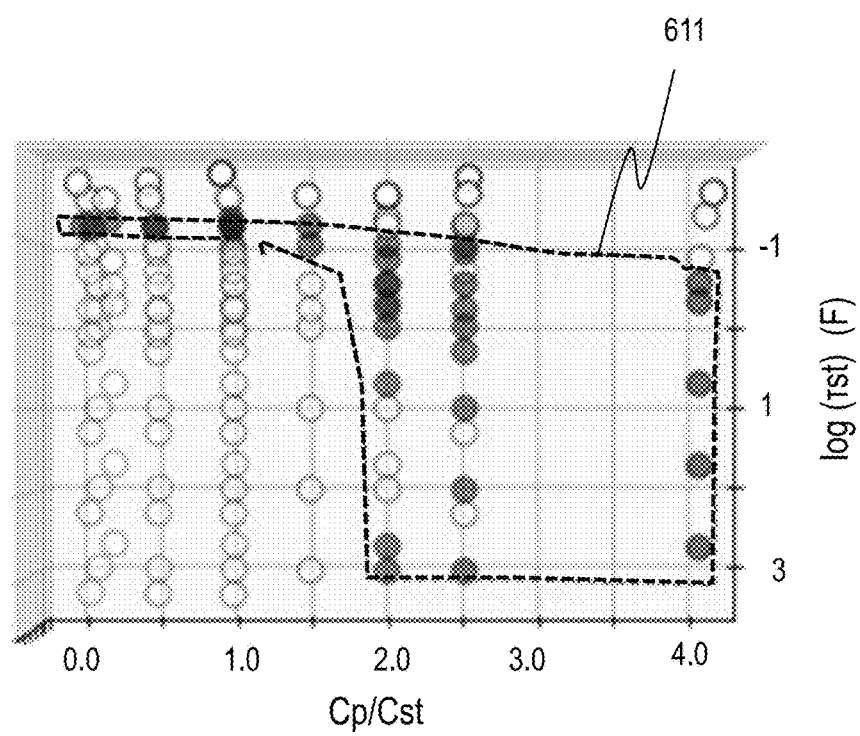
FIG. 12 provides simulation results about the relation among the value of the ratio of the capacitance of the capacitor Cp to the capacitance of the storage capacitor Cst, the time constant τst, and the intensity of the ghost.

First, the range of the time constant τst (the value of Cst*the value of Rst) and the range of the value of the ratio of the capacitance of the capacitor Cp to the capacitance of the storage capacitor Cst (the value of Cp/the value of Cst) to make the absolute value of the intensity of the ghost fall in the range of not more than 0.005 (the value of the intensity be not less than −0.005 but not more than +0.005) are described. FIG. 12 provides simulation results about the relation among the value of the ratio of the capacitance of the capacitor Cp to the capacitance of the storage capacitor Cst, the time constant τst, and the intensity of the ghost.

In the graph of FIG. 12, the horizontal axis represents the value of the ratio of the capacitance of the capacitor Cp to the capacitance of the storage capacitor Cst and the vertical axis represents the logarithmic value of the time constant τst. The not-shown axis along the normal to FIG. 12 represents the intensity of the ghost. In the graph of FIG. 12, the region 611 surrounded by a broken line represents the range where the absolute value of the intensity of the ghost is not more than 0.005.

The simulation results in FIG. 12 indicates that one of the following two conditions has to be satisfied for the absolute value of the intensity of the ghost to be in the range of not more than 0.005. One of the conditions is that the time constant τst is not less than 0.06 s but less than 0.1 s (0.06 s≤τst<0.1 s).

The other condition is that the value of the ratio of the capacitance of the capacitor Cp to the capacitance of the storage capacitor Cst is not less than 2.0 (the value of Cp/the value of Cst≥2.0) and the time constant τst is not less than 0.06 (τst≥0.06). When either one of these conditions is satisfied, combinations of a value of the ratio of the capacitance of the capacitor Cp to the capacitance of the storage capacitor Cst and a time constant exist that attain an absolute value not more than 0.005 for the intensity of the ghost.

Figure 13:
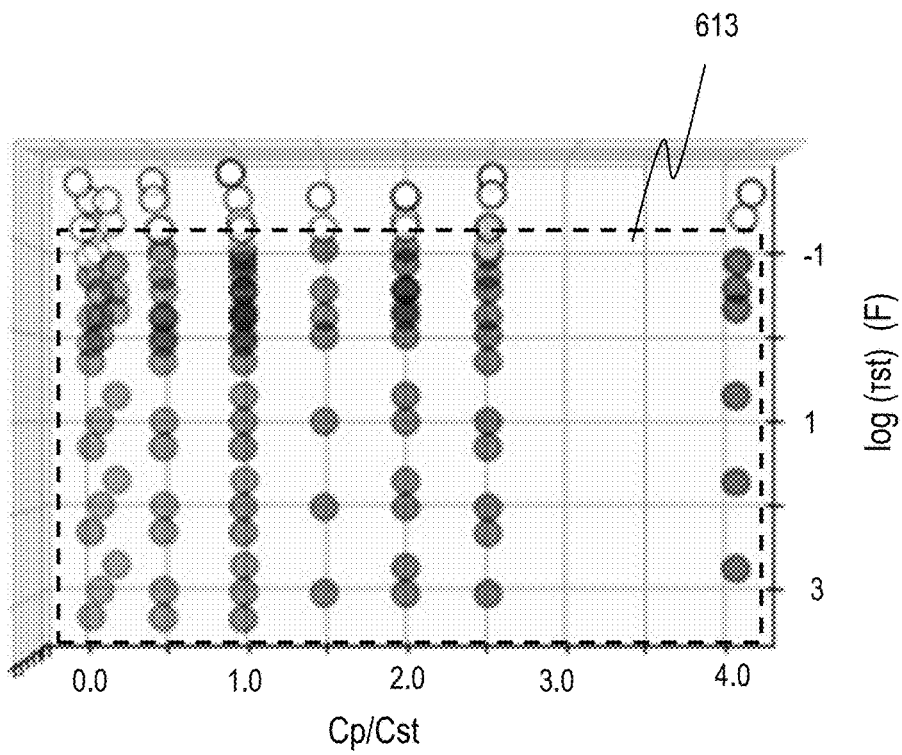
FIG. 13 provides simulation results about the relation among the value of the ratio of the capacitance of the capacitor Cp to the capacitance of the storage capacitor Cst, the time constant τst, and the intensity of the flicker.

Next, the range of the time constant τst (the value of Cst*the value of Rst) and the range of the value of the ratio of the capacitance of the capacitor Cp to the capacitance of the storage capacitor Cst (the value of Cp/the value of Cst) to make the intensity of the flicker fall in the range of not more than 0.5 are described. FIG. 13 provides simulation results about the relation among the value of the ratio of the capacitance of the capacitor Cp to the capacitance of the storage capacitor Cst, the time constant τst, and the intensity of the flicker.

In the graph of FIG. 13, the horizontal axis represents the value of the ratio of the capacitance of the capacitor Cp to the capacitance of the storage capacitor Cst and the vertical axis represents the logarithmic value of the time constant τst. The not-shown axis along the normal to FIG. 13 represents the intensity of the flicker. In the graph of FIG. 13, the region 613 surrounded by a broken line represents the range where the intensity of the flicker is not more than 0.5. The simulation results in FIG. 13 indicates that the time constant τst has to be not less than 0.1 (τst≥0.1 s) for the intensity of the flicker to be in the range of not more than 0.5. In this range, combinations of a value of the ratio of the capacitance of the capacitor Cp to the capacitance of the storage capacitor Cst and a time constant exist that attain a value not more than 0.5 for the intensity of the flicker.

Figure 14:
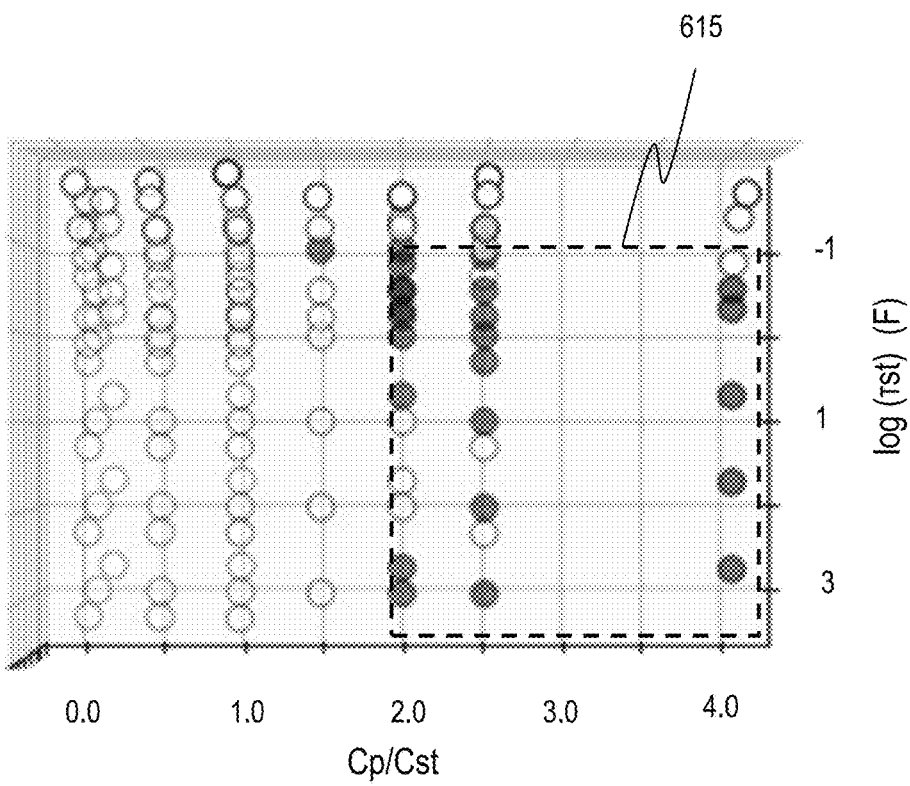
FIG. 14 provides simulation results about the relation among the value of the ratio of the capacitance of the capacitor Cp to the capacitance of the storage capacitor Cst, the time constant τst, and the intensity of the ghost under the condition that the intensity of the flicker is not more than 0.5.

FIG. 14 provides simulation results about the relation among the value of the ratio of the capacitance of the capacitor Cp to the capacitance of the storage capacitor Cst, the time constant τst, and the intensity of the ghost under the condition that the intensity of the flicker is not more than 0.5. The not-shown axis along the normal to FIG. 14 represents the intensity of the ghost. In the graph of FIG. 14, the region 615 surrounded by a broken line represents the range where the absolute value of the intensity of the ghost is not more than 0.005.

The simulation results in FIG. 14 indicate that the value of the ratio of the capacitance of the capacitor Cp to the capacitance of the storage capacitor Cst has to be not less than 2.0 (the value of Cp/the value of Cst 2.0) for the absolute value of the intensity of the ghost to be in the range of not more than 0.005. The foregoing research revealed that the absolute value of the intensity of the ghost will be not more than 0.005 and the intensity of the flicker is not more than 0.5, if the following conditions are satisfied.

The conditions to be satisfied are that the value of the ratio of the capacitance of the capacitor Cp to the capacitance of the storage capacitor Cst is not less than 2.0 (the value of Cp/the value of Cst≥2.0) and that the time constant τst (the value of Cst*the value of Rst) is not less than 0.1 s (τst≥ 0.1 s).

As described above, the image retention of the OLED display device 10 can be reduced more effectively by determining the capacitances of the storage capacitor Cst and the capacitor Cp and the resistance of the resistor Rst to satisfy the predetermined conditions. Even if the finite resistor Rst is not included (the resistance is infinite), the image retention can be reduced by adding the capacitor Cp.

Device Structure

Figure 15:
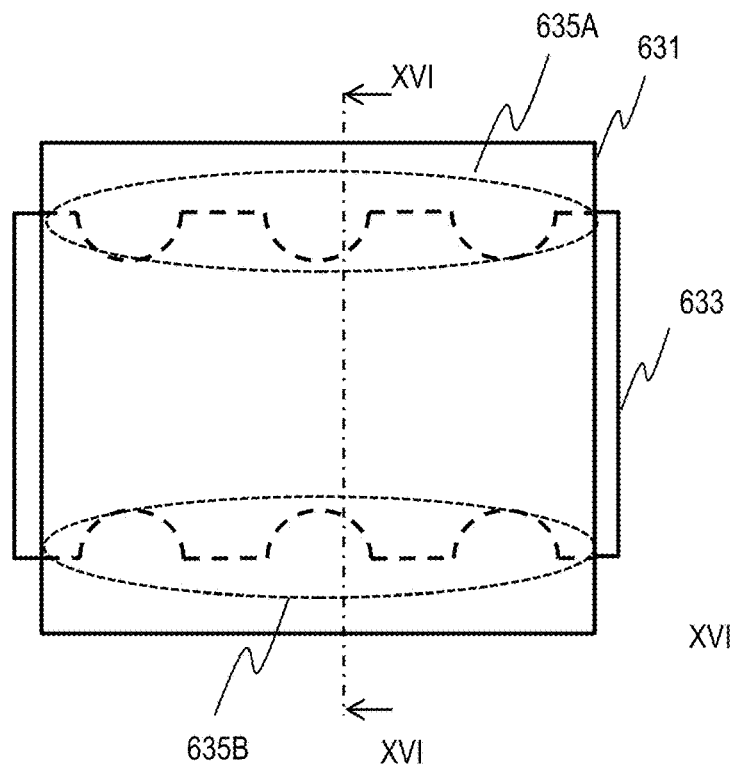
FIG. 15 is a plan diagram schematically illustrating a structural part including a storage capacitor Cst and a resistor Rst.

Hereinafter, examples of the device structures of the storage capacitor Cst, the resistor Rst, and the capacitor Cp in a pixel circuit are described. FIG. 15 is a plan diagram schematically illustrating a structural part including the storage capacitor Cst and the resistor Rst. The storage capacitor Cst includes an upper electrode 631 and a lower electrode 633 opposed to the upper electrode 631. The metal material for the upper electrode 631 and the lower electrode 633 can be selected desirably; for example, Mo, W, Nb, or Al can be employed. An insulating layer is provided between the upper electrode 631 and the lower electrode 633, although it is not shown in FIG. 15. Parts of the upper electrode 631 overhang edges of the lower electrode 633. These overlap regions 635A and 635B become the resistor Rst.

Figure 16:
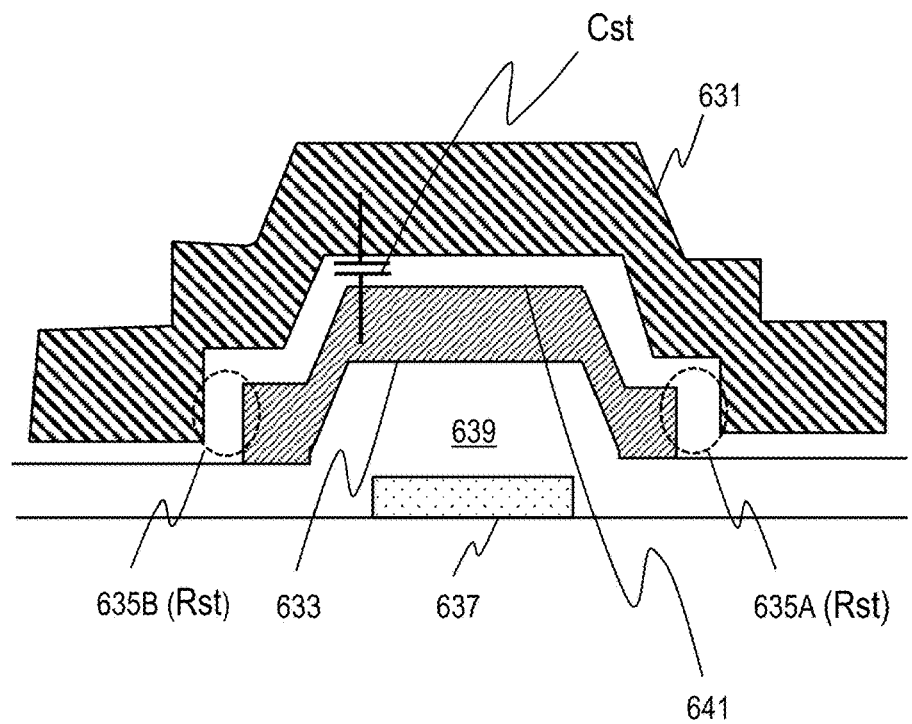
FIG. 16 schematically illustrates the cross-sectional structure along the section line XVI-XVI in FIG. 15.

FIG. 16 schematically illustrates the cross-sectional structure along the section line XVI-XVI in FIG. 15. A gate insulating film 639 is laid to cover a polysilicon film 637. The gate insulating film 639 can be a silicon oxide film, a silicon nitride film, or a laminate of these films. A lower electrode (gate electrode) 633 is laid on the gate insulating film 639 and further, an interlayer metallic dielectric film 641 is laid to cover the lower electrode (gate electrode) 633. The upper electrode 631 is laid on the interlayer metallic dielectric film 641 to be opposed to the lower electrode 633.

The interlayer metallic dielectric film 641 is an inorganic thin film (having a thickness of 100 nm, for example) and can be a silicon nitride film or a silicon oxide film. The thin interlayer metallic dielectric film 641 has a finite resistance; it can become a resistor between the edge of the lower electrode 633 and the overhanging part of the upper electrode 631. The resistance of the resistor Rst can be controlled by changing the length of the perimeter of the lower electrode 633 overhung by the upper electrode 631. Specifically, the resistance can be decreased by elongating the perimeter.

As described above, the storage capacitor Cst includes a part of the lower electrode 633, a part of the upper electrode 631, and a part of the interlayer metallic dielectric film 641. The resistor Rst is formed in a part of the interlayer metallic dielectric film 641 located between the edge of the lower electrode 633 and the part of the upper electrode 631 overhanging the edge.

Figure 17:
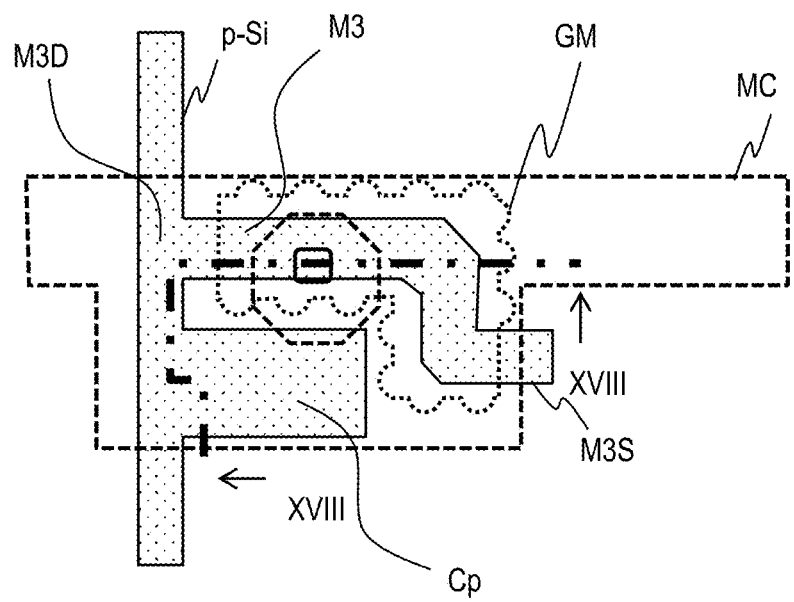
FIG. 17 is a schematic plan diagram of a part of a pixel circuit including its storage capacitor Cst, capacitor Cp, and resistor Rst.

FIG. 17 is a schematic plan diagram of a part of a pixel circuit including its storage capacitor Cst, capacitor Cp, resistor Rst, and driving transistor M3. A gate electrode GM is provided to cover a part of a poly-silicon film p-Si. The gate electrode GM is the gate electrode of the driving transistor M3. The poly-silicon film p-Si includes the source M3S and the drain M3D of the driving transistor M3. Further, an upper electrode MC is provided to cover the gate electrode GM.

Figure 18:
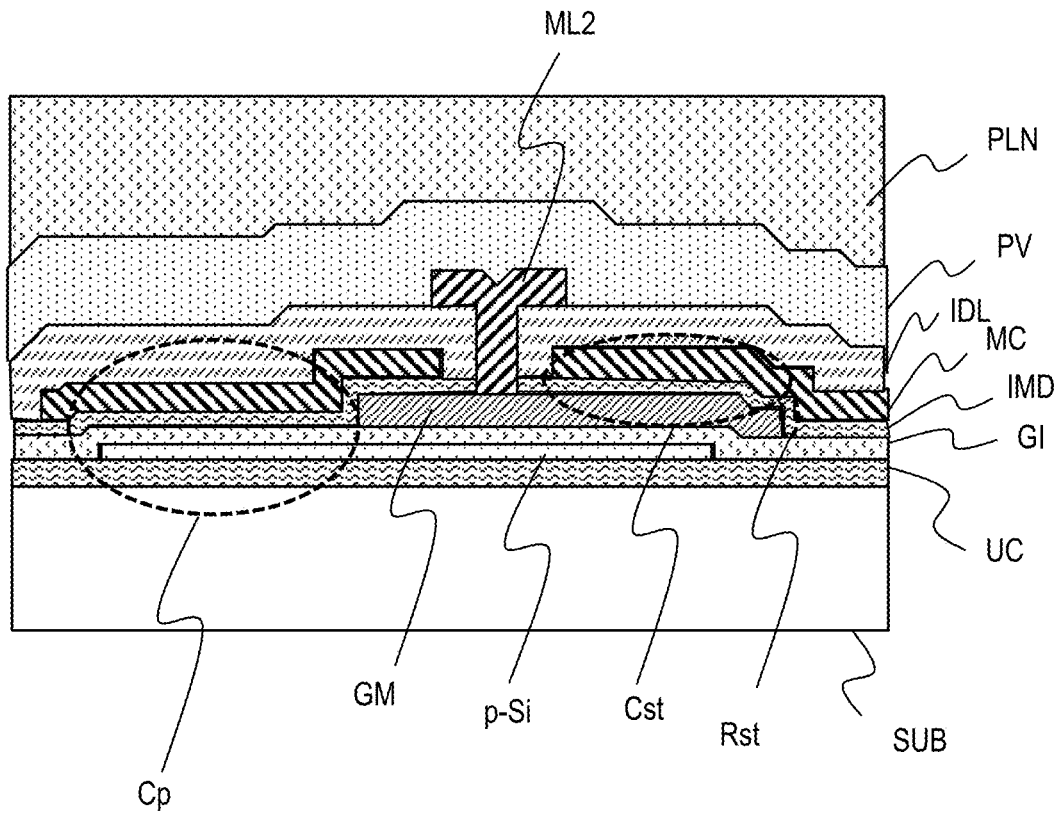
FIG. 18 schematically illustrates the cross-sectional structure along the section line XVIII-XVIII in FIG. 17.

FIG. 18 schematically illustrates the cross-sectional structure along the section line XVIII-XVIII in FIG. 17. An underlayer film UC made of silicon nitride, for example, is provided on a substrate SUB. The poly-silicon film p-Si is laid on the underlayer film UC. Further, a gate insulating film GI is laid to cover the poly-silicon layer p-Si.

The gate electrode GM is laid on the gate insulating film GI. The interlayer metallic dielectric film IMD is laid to cover the gate electrode GM. The upper electrode MC is laid on the interlayer metallic dielectric film IMD. A part of the upper electrode MC is opposed to the gate electrode GM across the interlayer metallic dielectric film IMD to form the storage capacitor Cst.

The part of the upper electrode MC overhangs the edge of the gate electrode GM to form the resistor Rst there. Another part of the upper electrode MC is opposed to the poly-silicon film p-Si across the interlayer metallic dielectric film IMD and the gate insulating film GI to form the capacitor Cp.

An interlayer insulating film IDL is laid to cover the upper electrode MC. A contact hole is opened through the interlayer insulating film IDL, the upper electrode MC, and the interlayer metallic dielectric film IMD. A metallic line ML2 is in contact with the gate electrode GM in the contact hole. A passivation film PV and a planarization film PLN thereabove are provided to cover the whole element illustrated in FIG. 18. The interlayer insulating film IDL and the passivation film PV can be inorganic films such as a silicon nitride film or a silicon oxide film. The planarization film PLN can be an organic film.

As described above, configuring the pixel circuit to include the capacitor Cp and the resistor Rst does not increase the layout scale very much. Furthermore, the capacitor Cp and the resistor Rst can be fabricated without increasing the manufacturing process of the TFTs and the pixel circuit. Accordingly, an OLED display device that can display high-quality images with less image retention can be provided without increasing the cost or lowering the manufacturing yield.

Figure 19:
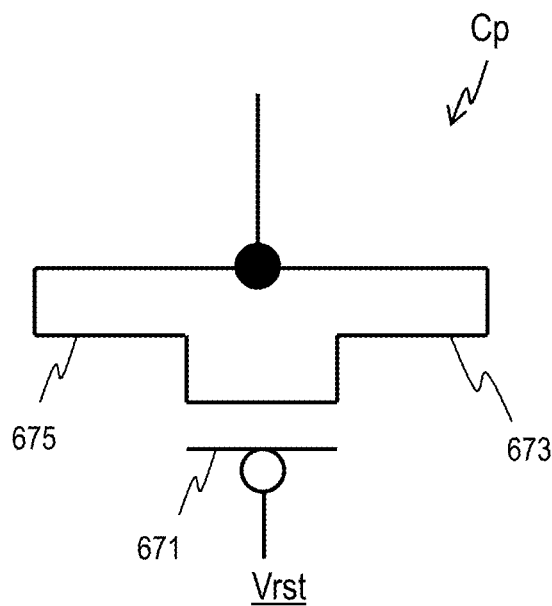
FIG. 19 illustrates a configuration example of the capacitor Cp.

Next, another configuration example of the capacitor Cp is described. FIG. 19 illustrates a configuration example of the capacitor Cp. As illustrated in FIG. 19, the capacitor Cp can be configured with a TFT in which the source 673 and the drain 675 are short-circuited. The gate 671, the source/drain 673, 675, and the gate insulating film interposed therebetween constitute a capacitor. The gate 671 is supplied with the reset potential of the reset power supply Vrst, for example. The TFT in the example in FIG. 19 is a p-type TFT and therefore, the gate potential is lower than the source/drain potentials. This configuration achieves a small-size capacitor Cp.

Figure 20:
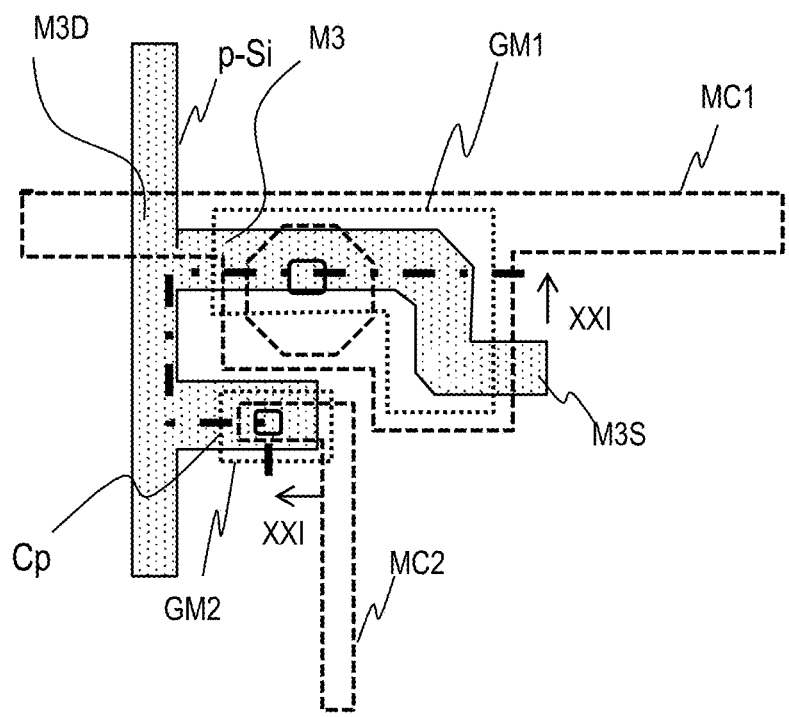
FIG. 20 is a schematic plan diagram of a part of a pixel circuit including its storage capacitor Cst, capacitor Cp, and resistor Rst.

FIG. 20 is a schematic plan diagram of a part of a pixel circuit including its storage capacitor Cst, capacitor Cp, resistor Rst, and driving transistor M3. The capacitor Cp has the configuration illustrated in FIG. 19. A gate electrode GM1 is provided to cover a part of a poly-silicon film p-Si. The gate electrode GM1 is the gate electrode of the driving transistor M3. The poly-silicon film p-Si includes the source M3S and the drain M3D of the driving transistor M3. Further, an upper electrode MC1 is provided to cover the gate electrode GM1.

Another gate electrode GM2 is provided on the same layer as the gate electrode GM1 to cover another part of the poly-silicon film p-Si. The gate electrode GM2 is the gate electrode of the capacitor Cp configured as a TFT. An upper electrode MC2 is provided on the same layer as the upper electrode MC1 to cover a part of the gate electrode GM2.

Figure 21:
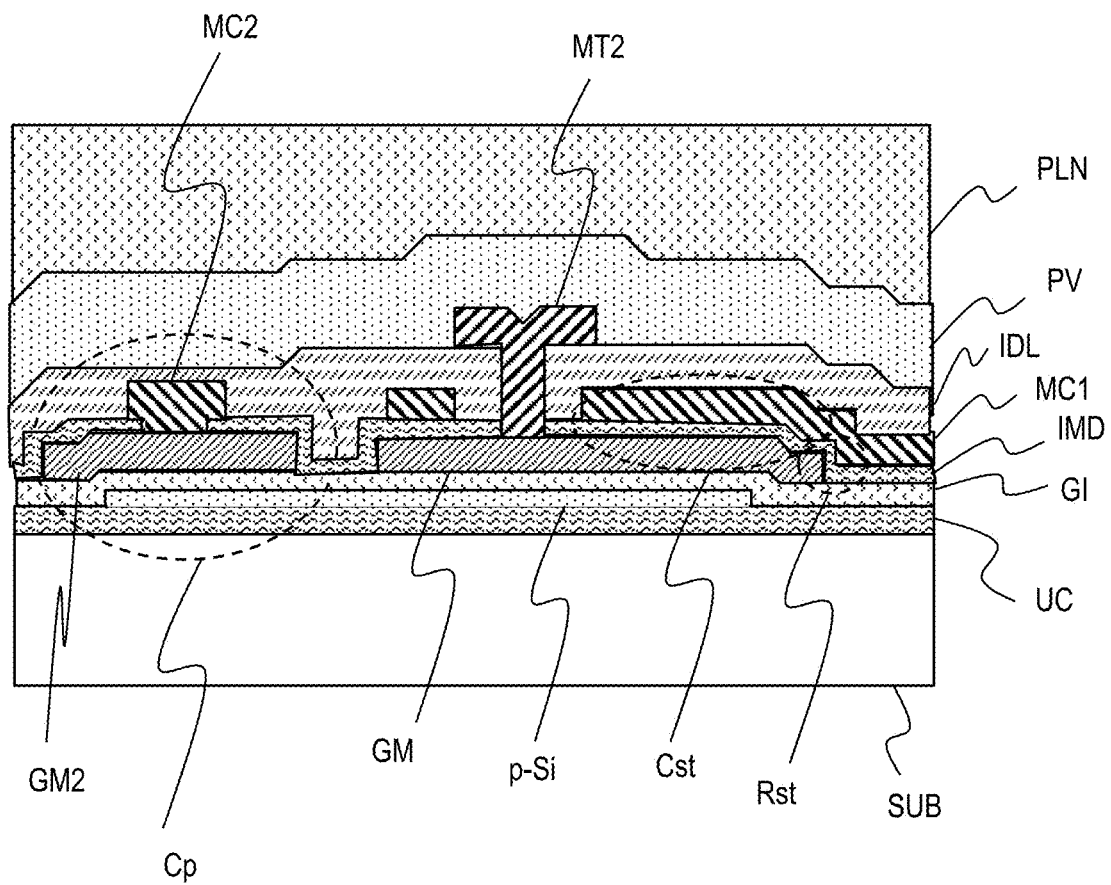
FIG. 21 schematically illustrates the cross-sectional structure along the section line XXI-XXI in FIG. 20.

FIG. 21 schematically illustrates the cross-sectional structure along the section line XXI-XXI in FIG. 20. Differences from the configuration example in FIG. 18 are mainly described in the following. The gate electrode GM2, a part of the poly-silicon film p-Si opposed to the gate electrode GM2, and the gate insulating film GI therebetween constitute the capacitor Cp. The upper electrode MC2 is in contact with the gate electrode GM2 through a contact hole opened through the interlayer metallic dielectric film IMD. The upper electrode MC2 supplies the gate electrode GM2 with the reset potential from the reset power supply Vrst. As noted from this description, the capacitor Cp is a metal-insulator-semiconductor (MIS) type of capacitor formed by stacking an insulating layer and a metallic layer on a semiconductor film.

Figure 22:
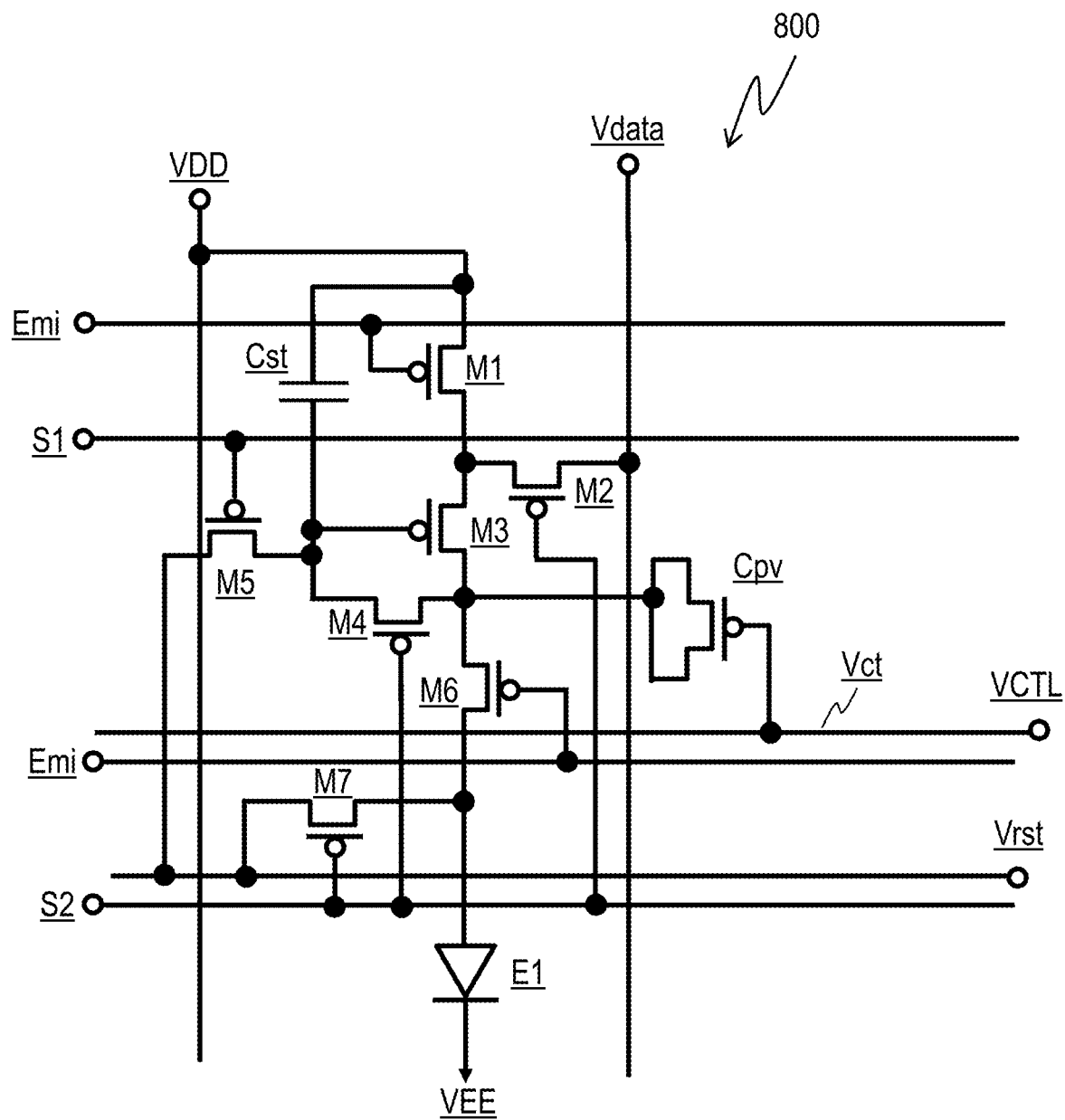
FIG. 22 illustrates another configuration example of a pixel circuit.

FIG. 22 illustrates a configuration example 800 of a pixel circuit based on FIG. 19. It is known that OLED display devices 10 are varied in characteristics when they are manufactured. As illustrated in FIG. 12, the time constant and the value of the value of Cp/the value of Cst achieving weak ghost have a relationship like the region 611. For example, in the case where the value of Rst or the value of Cst varies among OLED display devices, the ratio of the Cp value to the Cst value can be adjusted depending on the variation, if the capacitor Cp is a variable capacitor.

The pixel circuit 800 in FIG. 22 includes a variable capacitor Cpv connected with the drain node of the driving transistor M3, instead of the capacitor Cp in the pixel circuit 500 in FIG. 5. The variable capacitor Cpv can be an MIS capacitor. The driver IC 134 applies a variable control potential VCTL to the gate electrode of the variable capacitor Cpv through a lead line Vct. As a result, the capacitance of the variable capacitor Cpv can be controlled from the external with its gate electrode potential. The intensity of image retention of each product can be minimized individually by controlling the capacitance of the variable capacitor Cpv with the control potential VCTL.

Figure 23:
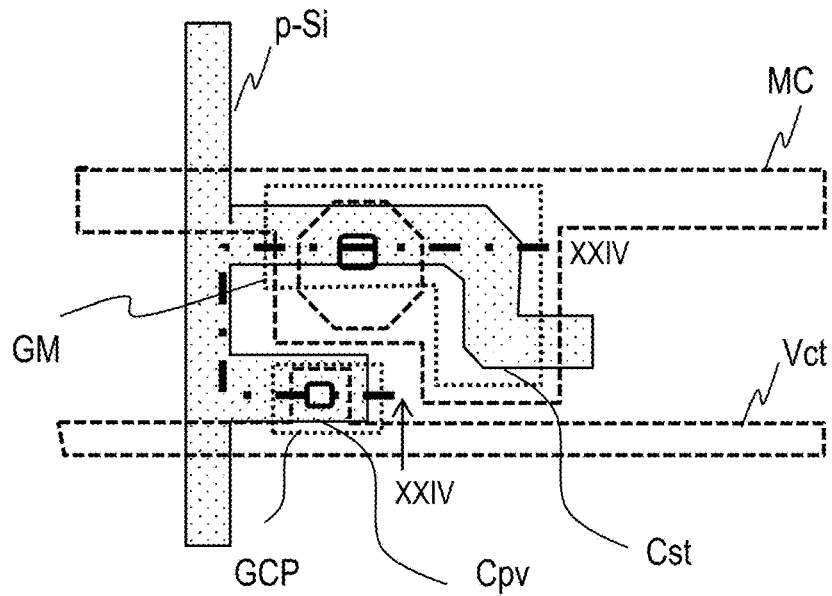
FIG. 23 illustrates a planar pattern of a pixel including a variable capacitor and a lead line.

FIG. 23 illustrates a planar pattern of a pixel including a variable capacitor Cpv and a lead line Vcl. In the configuration described with reference to FIGS. 19 and 20, the gate electrode GM2 of the capacitor Cp configured as a TFT is supplied with a reset potential from the reset power supply Vrst. In contrast, the gate electrode GCP of this variable capacitor Cpv in FIGS. 22 and 23 is supplied with a variable control potential VCTL through a line Vct.

Figure 24:
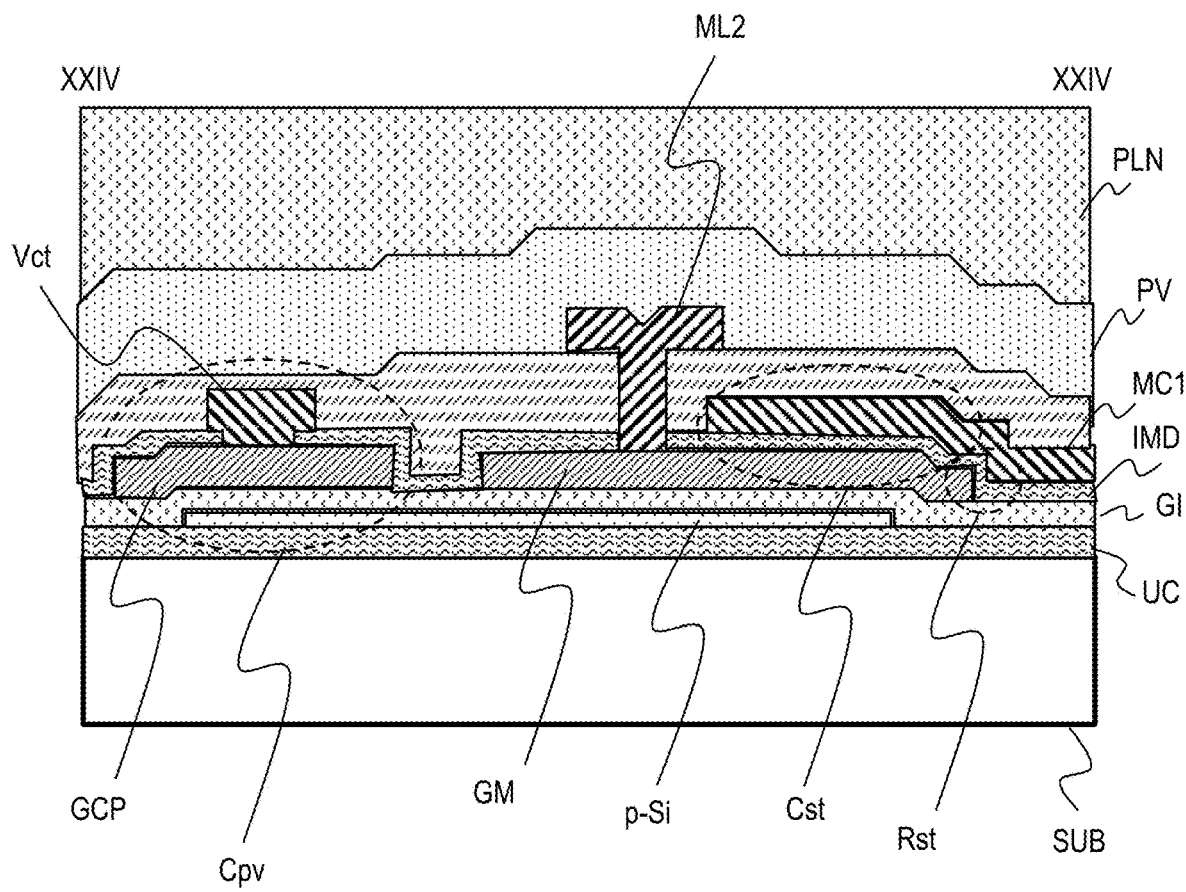
FIG. 24 is a cross-sectional diagram along the section line XXIV-XXIV in FIG. 23.

FIG. 24 is a cross-sectional diagram along the section line XXIV-XXIV in FIG. 23. The cross-sectional structure is the same as the one illustrated in FIG. 21, except that the capacitor Cpv has replaced the capacitor Cp. The variable capacitor Cpv has the same laminate structure as the structure described with reference to FIG. 21. The gate electrode GCP of the variable capacitor Cpv is led out of the panel region by the lead line Vct. The lead line Vct is made of the same material as the upper electrode MC1. The lead line Vct is led out in parallel to the scanning line of the row and all lead lines Vct are joined in the outside of the display region to be supplied with a control potential all together.

Figure 25:
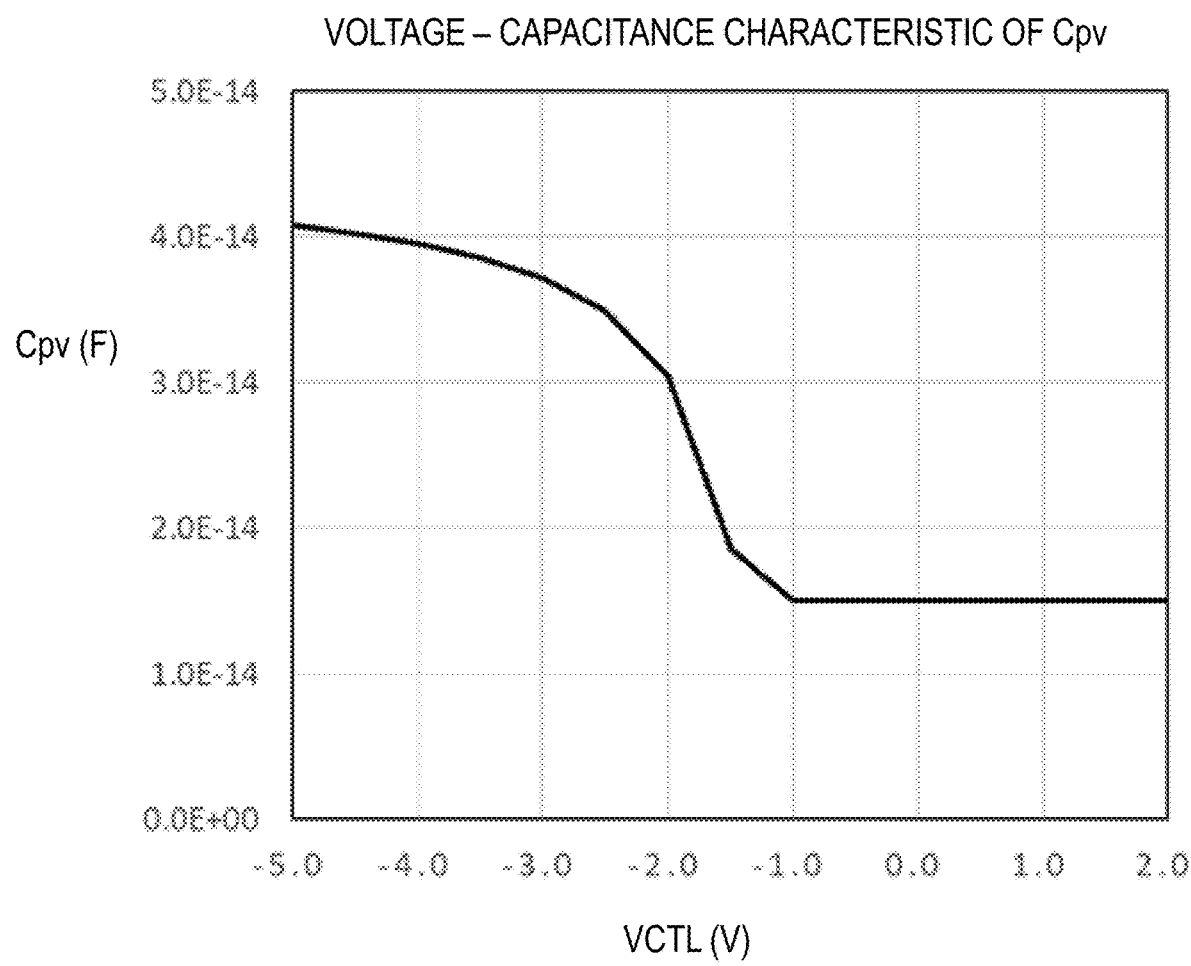
FIG. 25 illustrates an example of a voltage-capacitance characteristic of a variable capacitor.

FIG. 25 provides an example of the voltage-capacitance characteristic of a variable capacitor Cpv. The capacitance is variable within a range between 15 fF to 40 fF with the control potential VCTL. Hence, the capacitor Cpv enables adjustment of the ratio of the value Cpv to the value of Cst from the external. In real products, the behaviors of their ghosts have variations in a certain range because of the variations in transient response characteristic of the TFT, the value of Rst, and the value of Cst. The intensity of image retention of each panel can be minimized by adjusting the values of the variable capacitors Cpv of the finished panel from the external to optimize the ratios of the values Cpv to the values of Cst.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A pixel circuit configured to control driving current for a light-emitting element, the pixel circuit comprising:
   a driving transistor configured to supply driving current to the light-emitting element;
   a first switching transistor including a source, a gate, and a drain, the first switching transistor being configured to transmit a data signal corresponding to the driving current;
   a storage capacitor configured to receive the data signal from the first switching transistor and store a voltage to be applied to the gate of the driving transistor;
   a first capacitor including an electrode directly connected with the drain of the driving transistor and an electrode to be supplied with a predetermined potential to receive the data signal from the first switching transistor through the driving transistor; and
   a second switching transistor connected between the storage capacitor and the first capacitor to transfer a voltage from the first capacitor to the storage capacitor for correcting the voltage to be stored to the storage capacitor.

2. The pixel circuit according to claim 1, wherein a value obtained by dividing the capacitance of the first capacitor by the capacitance of the storage capacitor is not less than 2.

3. The pixel circuit according to claim 1, further comprising:
   a resistor connected in parallel with the storage capacitor.

4. The pixel circuit according to claim 3,
   wherein a product of the capacitance of the storage capacitor and the resistance of the resistor is not less than 0.1 seconds, and wherein a value obtained by dividing the capacitance of the first capacitor by the capacitance of the storage capacitor is not less than 2.

5. The pixel circuit according to claim 3, further comprising:
a lower electrode;
an upper electrode; and
a dielectric film between the lower electrode and the upper electrode,
wherein the storage capacitor includes a part of the lower electrode, a part of the upper electrode, and a part of the dielectric film between the part of the lower electrode and the part of the upper electrode, and
wherein the resistor is formed in a part of the dielectric film located between an edge of the lower electrode and a part of the upper electrode overhanding the edge.

6. The pixel circuit according to claim 1, wherein the first capacitor is a metal-insulator-semiconductor capacitor having a laminate structure of an insulating layer, a metal layer, and a semiconductor film.

7. The pixel circuit according to claim 1,
wherein the first switching transistor and the second switching transistor are configured to be turned on simultaneously,
wherein the second switching transistor is configured to keep the driving transistor in a diode-connected state when the second switching transistor is ON, and
wherein charges to be stored to the storage capacitor are supplied to the storage capacitor through a channel of the driving transistor in the diode-connected state.

8. The pixel circuit according to claim 1, wherein the first capacitor includes:
a lower electrode included in the same semiconductor film as the drain of the driving transistor; and
an insulating film and an upper electrode layered on the lower electrode.

9. The pixel circuit according to claim 1, wherein the first capacitor is a variable capacitor.

10. The pixel circuit according to claim 1, further comprising:
a third switching transistor configured to control ON/OFF of supply of electric current to the driving transistor;
a fourth switching transistor configured to supply a first reset potential to the gate of the driving transistor;
a fifth switching transistor located between the driving transistor and the light-emitting element, the fifth switching transistor being configured to control ON/OFF of supply of electric current to the light-emitting element; and
a sixth switching transistor configured to supply a second reset potential to the anode of the light-emitting element.

* * * * *